US011551947B2

(12) United States Patent
Kakinuma et al.

(10) Patent No.: US 11,551,947 B2
(45) Date of Patent: Jan. 10, 2023

(54) RESIN COATING APPLYING APPARATUS AND METHOD OF APPLYING RESIN COATING

(71) Applicant: DISCO CORPORATION, Tokyo (JP)

(72) Inventors: Yoshinori Kakinuma, Tokyo (JP); Yoshikuni Migiyama, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 103 days.

(21) Appl. No.: 17/004,500

(22) Filed: Aug. 27, 2020

(65) Prior Publication Data

US 2021/0066103 A1 Mar. 4, 2021

(30) Foreign Application Priority Data

Sep. 3, 2019 (JP) .............................. JP2019-160480

(51) Int. Cl.
*H01L 21/67* (2006.01)
*H01L 21/56* (2006.01)
*H01L 21/683* (2006.01)
*H01L 23/31* (2006.01)

(52) U.S. Cl.
CPC ........ *H01L 21/67126* (2013.01); *H01L 21/56* (2013.01); *H01L 21/67092* (2013.01); *H01L 21/67103* (2013.01); *H01L 21/6838* (2013.01); *H01L 23/3171* (2013.01)

(58) Field of Classification Search
CPC ............... H01L 21/67126; H01L 21/56; H01L 21/67092; H01L 21/67103; H01L 21/6838; H01L 23/3171; H01L 21/6719; H01L 21/6715; H01L 21/67109; H01L 21/67742; H01L 21/68742; B29C 43/18;
(Continued)

(56) References Cited

U.S. PATENT DOCUMENTS

2013/0318934 A1* 12/2013 Stutzman .............. B08B 15/002
55/428
2015/0079890 A1* 3/2015 Stutzman ............. B65G 69/186
454/49

FOREIGN PATENT DOCUMENTS

JP 2005324341 A 11/2005
JP 2008302535 A 12/2008
(Continued)

OTHER PUBLICATIONS

Office Action issued in counterpart German patent application No. 10 2020 211 060.3, dated Jul. 20, 2022.

*Primary Examiner* — Mohammed Shamsuzzaman
(74) *Attorney, Agent, or Firm* — Greer Burns & Crain Ltd.

(57) ABSTRACT

A resin coating applying apparatus includes a housing, a lid, a lid actuator for actuating the lid openably and closably with respect to the housing, a resin supply for supplying a solid resin to a workpiece, a vacuum pump for evacuating a processing space hermetically sealed by the housing and the lid, and an atmospheric vent valve for introducing atmospheric air into the processing space to cool the resin applied to the workpiece. The housing includes a holding table and a holding table actuator for moving the holding table upwardly and downwardly. The lid includes an upper table disposed opposite the holding table and movable relatively closely to the holding table to spread the resin supplied to the workpiece and coat the workpiece with the resin. When the lid is closed, it covers the opening in the housing to create the hermetically sealed processing space.

3 Claims, 15 Drawing Sheets

(58) Field of Classification Search
CPC ......... B29C 43/34; B29C 43/52; B29C 43/56; B29C 2043/561
See application file for complete search history.

(56) References Cited

FOREIGN PATENT DOCUMENTS

| | | |
|---|---|---|
| JP | 2009148866 A | 7/2009 |
| JP | 2018144371 A | 9/2018 |

* cited by examiner

RESIN COATING APPLYING APPARATUS AND METHOD OF APPLYING RESIN COATING

BACKGROUND OF THE INVENTION

Field of the Invention

The present invention relates to a resin coating applying apparatus and a method of applying a resin coating.

Description of the Related Art

When various plate-shaped workpieces such as semiconductor wafers, resin-packaged substrates, ceramic substrates, glass substrates, etc. are to be ground to a thinner profile or to be divided by a cutting blade or a laser beam, the workpieces are held on a chuck table. While such a workpiece is being processed on the chuck table, the surface of the workpiece held on the chuck table needs to be protected against damage or contamination in contact with the chuck table. After a workpiece on the chuck table has been divided into a plurality of chips, it is desirable that the device chips can be transported all together from the chuck table. According to a known technology, the surface of the workpiece held on the chuck table is covered with a liquid resin (see JP2009-148866A).

SUMMARY OF THE INVENTION

However, the liquid resin is not easy to handle and is so bulky that it takes man-hours to transport and store.

It is therefore an object of the present invention to provide a resin coating applying apparatus and a method of applying a resin coating that use a solid resin.

In accordance with an aspect of the present invention, there is provided a resin coating applying apparatus for coating a surface of a workpiece with a resin, including: a housing including a holding table for holding the workpiece under suction thereon and a holding table actuator for moving the holding table upwardly and downwardly, the housing having an opening defined therein; a lid for covering the opening in the housing to create a processing space hermetically sealed by the lid and the housing; a lid actuator operatively coupling the housing and the lid to each other, for actuating the lid openably and closably with respect to the housing; a resin supply for supplying a solid resin to the workpiece held on the holding table; a vacuum pump for evacuating the processing space hermetically sealed by the housing and the lid; and an atmospheric vent valve for introducing atmospheric air into the processing space to cool the resin applied to the workpiece. The lid includes an upper table disposed opposite the holding table and movable relatively closely to the holding table to spread the resin supplied to the workpiece and coat the workpiece with the resin. The resin coating applying apparatus further includes a heating unit for melting the resin, the heating unit being disposed in one of or both the holding table and the upper table.

In the resin coating applying apparatus, the lid actuator may include a locus limiter for limiting a locus of the lid relatively movable with respect to the housing, and an actuation controller for applying actuating forces to the locus limiter to move the lid relatively to the housing. The locus limiter may include a fixed arm fixed with respect to the housing, a movable arm fixed with respect to the lid for movement with the lid, and a fulcrum point by which the fixed arm and the movable arm are relatively rotatably coupled to each other. The actuation controller may include a cylinder that extends and contracts uniaxially for applying actuating forces, the cylinder having an end rotatably coupled to the housing and another end rotatably coupled to the movable arm. When the cylinder extends and contracts, an angle formed between the fixed arm and the movable arm at the fulcrum point may be changed to move the lid relatively to the housing.

The resin coating applying apparatus may further include a delivery arm for unloading the workpiece from the holding table. The delivery arm may include a suction pad for attracting the workpiece under suction and a pad actuator for actuating the suction pad. The holding table may include a holding surface for holding the workpiece thereon, a suction groove defined in the holding surface, and a fluid communication channel providing fluid communication between the suction groove and a suction source. The holding surface may include at least three ejector pins and at least three pin actuators for moving the ejector pins upwardly and downwardly. The ejector pins may be moved to a height equal to or smaller than a height of the holding surface when the workpiece is to be held on the holding table, and be moved to a height larger than the height of the holding surface when the workpiece is to be unloaded from the holding table, and the delivery arm may be inserted into a clearance created by the ejector pins between the workpiece and the holding table and deliver the workpiece from the holding table.

In accordance with another aspect of the present invention, there is provided a method of applying a resin coating to a workpiece using a resin coating applying apparatus. The resin coating applying apparatus includes: a housing including a holding table for holding the workpiece under suction thereon and a holding table actuator for moving the holding table upwardly and downwardly, the housing having an opening defined therein; a lid for covering the opening in the housing to create a processing space hermetically sealed by the lid and the housing; a lid actuator operatively coupling the housing and the lid to each other, for actuating the lid openably and closably with respect to the housing; a resin supply for supplying a solid resin to the workpiece held on the holding table; a vacuum pump for evacuating the processing space hermetically sealed by the housing and the lid; and an atmospheric vent valve for introducing atmospheric air into the processing space to cool the resin applied to the workpiece. The lid includes an upper table disposed opposite the holding table and movable relatively closely to the holding table to spread the resin supplied to the workpiece and coat the workpiece with the resin. The resin coating applying apparatus further includes a heating unit for melting the resin, the heating unit being disposed in one of or both the holding table and the upper table. The method includes: a heating step of heating the holding table; a holding step of holding the workpiece on the holding table; a resin supplying step of supplying a solid resin to an upper surface of the workpiece held on the holding table; a resin liquifying step of liquifying the resin with the heated holding table; a hermetically sealing step of closing the lid in covering relation to the opening in the housing to create a processing space hermetically sealed by the housing and the lid; a vacuum developing step of evacuating the processing space with the vacuum pump; a resin applying step, after the vacuum developing step, of lifting the holding table to spread the resin between the holding table and the upper table to coat the workpiece with the resin; a resin cooling step of stopping heating the holding table while the holding table is being lifted and introducing atmospheric air through the atmospheric vent valve to cool and solidify the resin; a holding table lowering step of holding the workpiece under suction on the holding table and lowering the holding table; and an unloading step, after the holding table lowering step, of opening the lid and unloading the workpiece coated with the resin from the holding table.

According the aspect or the other aspect of the present invention, a workpiece can be coated with a resin using a solid resin.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

Modes for carrying out the present invention, i.e., embodiments of the present invention, will hereinafter be described in detail below with reference to the drawings. The present invention is not limited to the details of the embodiments described below. The components described below cover those which could easily be anticipated by those skilled in the art and those which are essentially identical thereto. Furthermore, the arrangements described below can be used in appropriate combinations. Various omissions, replacements, or changes of the arrangements may be made without departing from the scope of the present invention.

Embodiment

Figure 1:
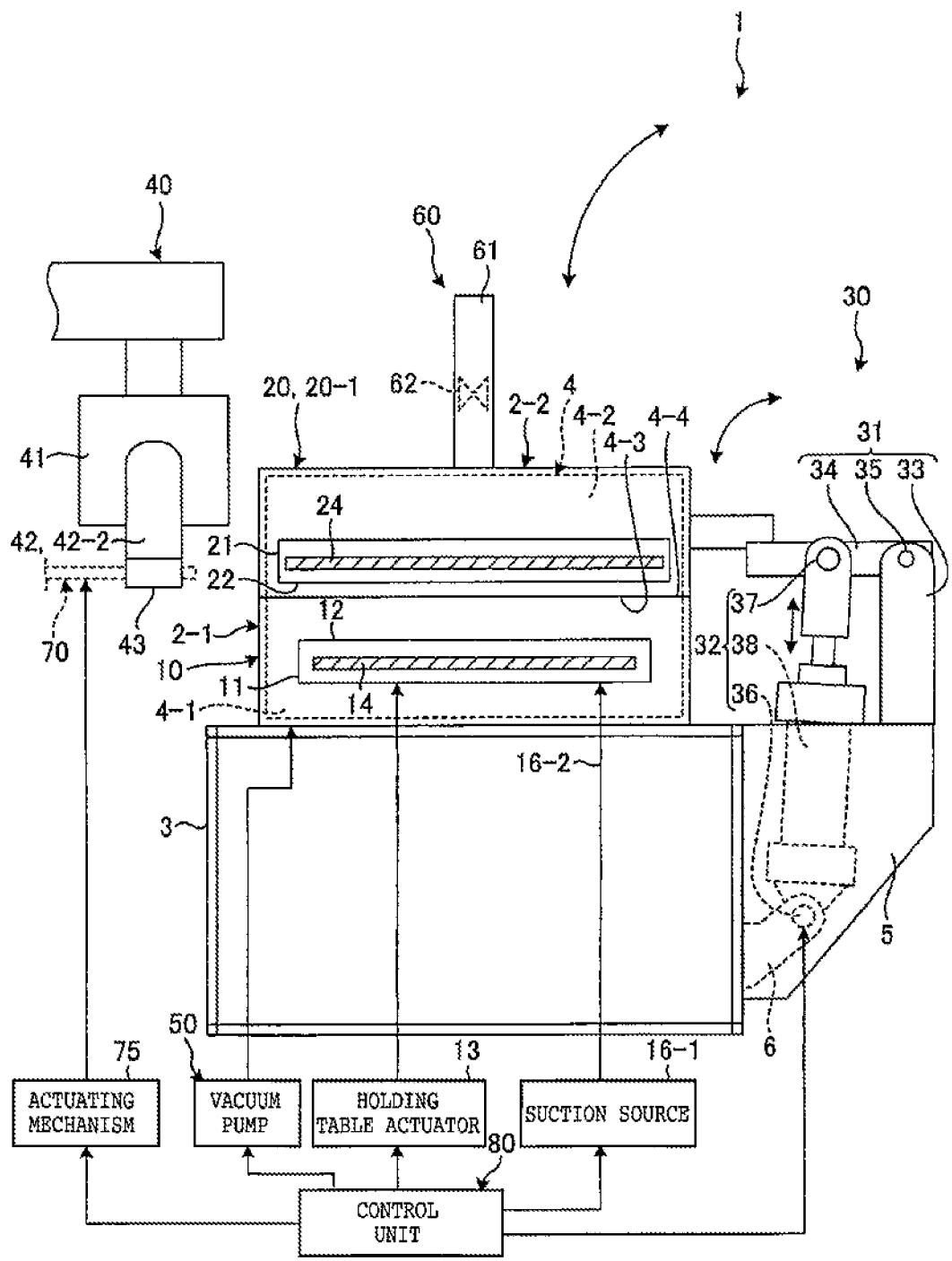
FIG. 1 is a cross-sectional view of a resin coating applying apparatus according to an embodiment of the present invention, illustrating the resin coating applying apparatus in a state.
Figure 2:
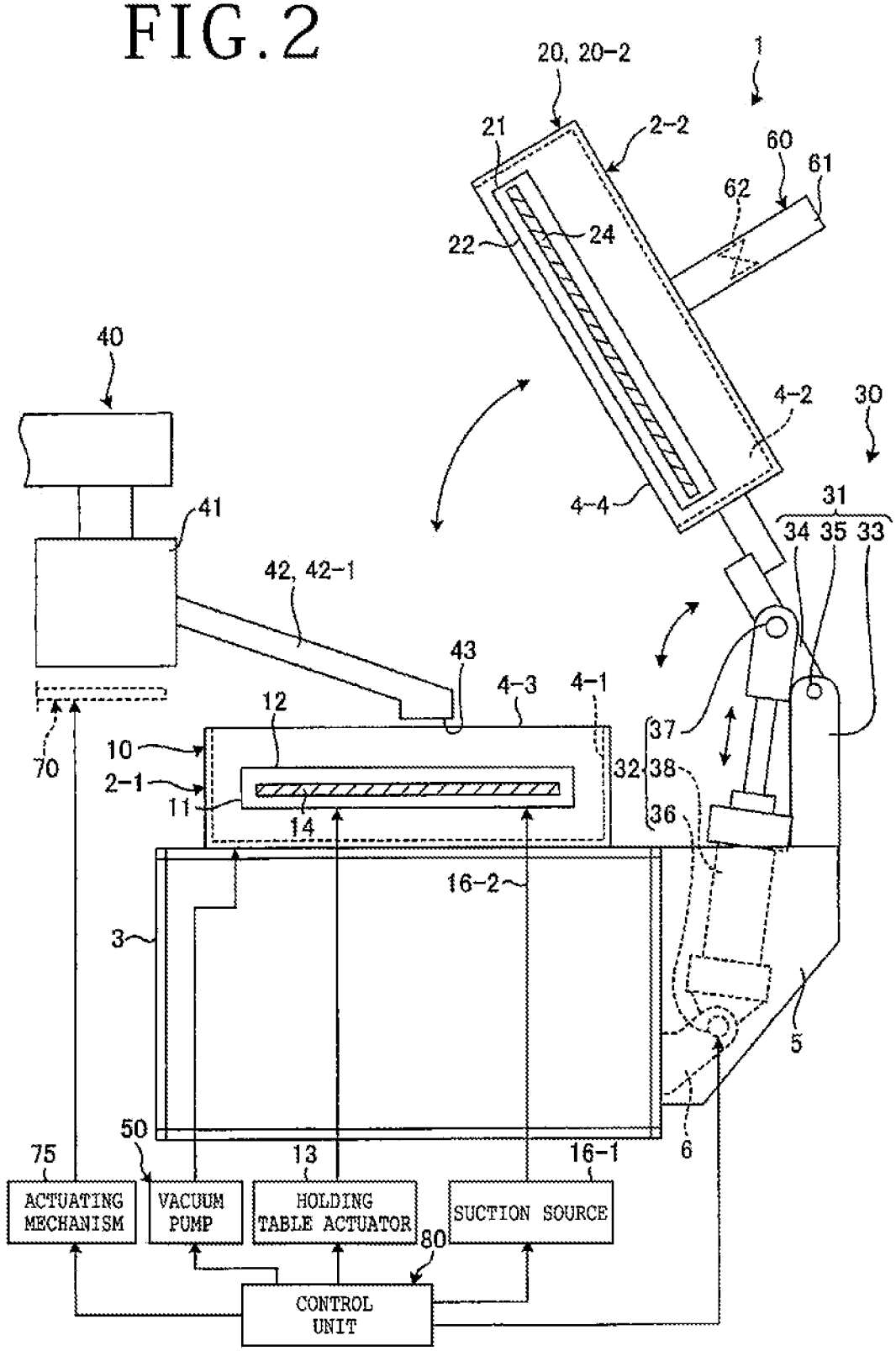
FIG. 2 is a cross-sectional view of a resin coating applying apparatus according to the embodiment, illustrating the resin coating applying apparatus in another state.
Figure 3:
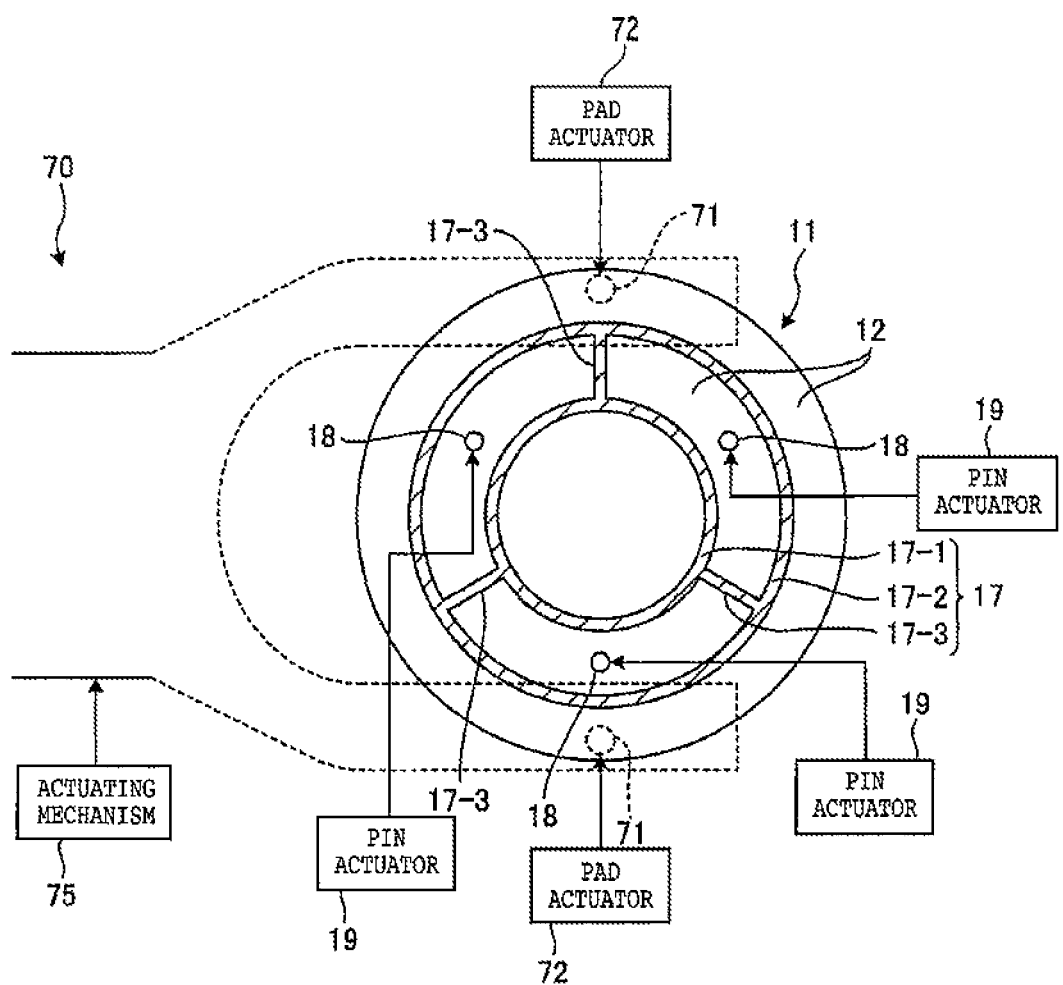
FIG. 3 is a plan view of a holding table and a portion of a delivery arm illustrated in FIGS. 1 and 2.

A resin coating applying apparatus 1 and a method of applying a resin coating according to an embodiment of the present invention will be described below with reference to the drawings. FIG. 1 illustrates in cross section the resin coating applying apparatus 1 according to the present embodiment, illustrating the resin coating applying apparatus 1 in a state. FIG. 2 illustrates in cross section the resin coating applying apparatus 1 according to the present embodiment, illustrating the resin coating applying apparatus 1 in another state. FIG. 3 illustrates in plan a holding table 11 and a portion of a delivery arm 70 illustrated in FIGS. 1 and 2. In FIGS. 1 and 2, ejector pins 18 and pin actuators 19 to be described later are omitted from illustration.

Figure 5:
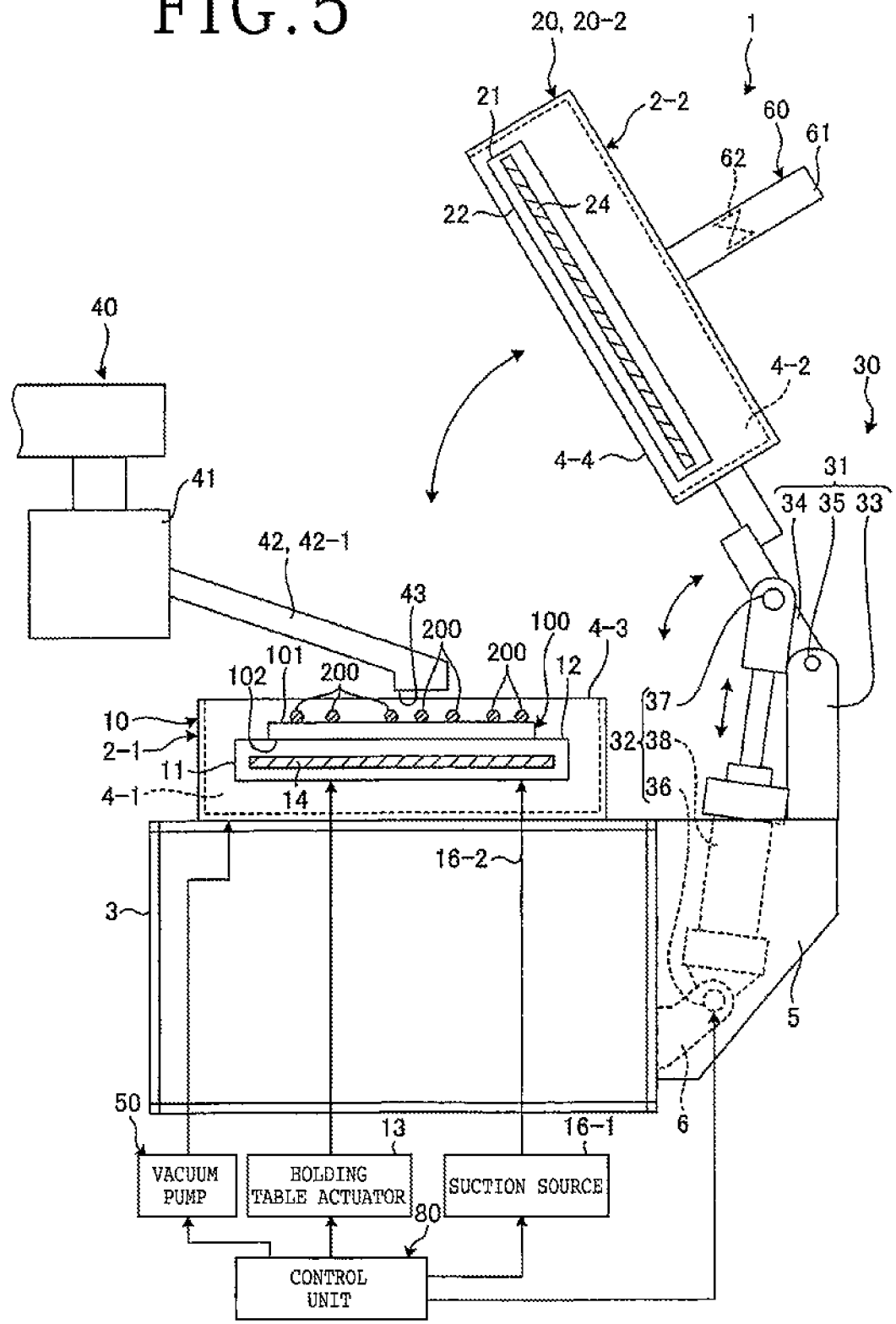
FIG. 5 is a cross-sectional view illustrating by way of example a heating step, a holding step, and a resin supplying step in FIG. 4.

The resin coating applying apparatus 1 illustrated in FIGS. 1 and 2 is an apparatus for coating a face side 101 (see FIG. 5, etc.) as a surface of a workpiece 100 (see FIG. 5, etc.) with a resin 202 (see FIG. 8, etc.), using a solid resin 200 (see FIG. 5, etc.). The resin 202 refers to a coating layer produced by liquifying the solid resin 200 into a liquified resin 201 (see FIG. 5), then modifying the liquified resin 201, and solidifying the modified liquified resin 201. The resin coating applying apparatus 1 according to the present embodiment applies the resin 202 to the face side 101 of the workpiece 100. However, the present invention is not limited to such details. According to the present invention, the resin 202 may be applied to a reverse side 102 of the workpiece 100.

The workpiece 100 as a target to which the resin 202 is applied by the resin coating applying apparatus 1 and the method of applying a resin coating according to the present embodiment is a disk-shaped semiconductor wafer or an optical device wafer including a substrate made of silicon, sapphire, gallium arsenide, or the like. The workpiece 100 has a plurality of devices, not illustrated, formed in respective areas, not illustrated, demarcated on the face side 101 by a plurality of intersecting projected dicing lines, not illustrated. The reverse side 102 of the workpiece 100 that is opposite the face side 101 thereof is made flatwise. The workpiece 100 will be divided into individual device chips along the projected dicing lines by being processed by a cutting blade, a laser beam, or the like, not illustrated. According to the present embodiment, the devices on the workpiece 100 may have flat surfaces or may have surface irregularities in the form of electrode bumps or the like thereon.

As illustrated in FIGS. 1 and 2, the resin coating applying apparatus 1 according to the present embodiment includes a housing 10, a lid 20, a lid actuator 30, a resin supply 40, a vacuum pump 50, an atmospheric vent 60, a delivery arm 70, and a control unit 80 for controlling various components of the resin coating applying apparatus 1.

As illustrated in FIGS. 1 and 2, the housing 10 includes a casing 2-1 and a frame 3. The casing 2-1 is disposed vertically upwardly of the frame 3. The frame 3 includes a plurality of frame members assembled together into a rectangular parallelepiped. The frame 3 supports a lower surface of the casing 2-1 fixedly on a vertically upper side thereof. The casing 2-1 defines a space 4-1 therein and has an opening 4-3 through which the space 4-1 is open vertically upwardly.

As illustrated in FIGS. 1 and 2, the housing 10 includes a circular holding table 11 for holding the workpiece 100 under suction thereon and a holding table actuator 13 for actuating the holding table 11 upwardly and downwardly. The holding table 11 is disposed in the space 4-1 in the casing 2-1. The holding table actuator 13 actuates the holding table 11 in vertical directions that are specifically represented by heightwise directions perpendicular to a holding surface 12 of the holding table 11 on which the workpiece 100 is to be held.

As illustrated in FIG. 3, the holding table 11 includes the holding surface 12 for holding the workpiece 100 thereon, suction grooves 17 defined in the holding surface 12, and a fluid communication channel 16-2 (see FIGS. 1 and 2) providing fluid communication between the suction grooves 17 and a suction source 16-1. The holding table 11 holds the workpiece 100 under suction on the holding surface 12 when a negative pressure introduced from the suction source 16-1 through the fluid communication channel 16-2 and the suction grooves 17 acts on the holding surface 12. According to the present embodiment, the suction grooves 17 defined in the holding surface 12 include circular suction grooves 17-1 and 17-2 concentric with an outer circumference of the holding surface 12 and straight suction grooves 17-3 radially interconnecting the suction grooves 17-1 and 17-2. However, the present invention is not limited to the illustrated suction grooves 17. The suction grooves defined in the holding surface 12 may be of any shape insofar as it can hold the workpiece 100 under suction on the holding surface 12 in its entirety.

As illustrated in FIGS. 1 and 2, furthermore, the holding table 11 further includes a heating unit 14 such as an electric resistance heater or the like disposed therein that performs a function of heating the holding table 11 to melt the solid resin 200 supplied to the workpiece 100 held on the holding surface 12.

As illustrated in FIG. 3, the holding table 11 also includes three or more ejector pins 18 and three or more pin actuators 19 for moving the respective ejector pins 18 upwardly and downwardly. The upward and downward directions in which the pin actuators 19 move the respective ejector pins 18 are specifically represented by the heightwise directions perpendicular to the holding surface 12 of the holding table 11. According to the present embodiment illustrated in FIG. 3, the ejector pins 18 are disposed in areas of the holding surface 12 between the suction grooves 17-1 and 17-2 clear of the suction grooves 17-3 and equally angularly spaced from each other by an angle of 120°, for example. However, the present invention is not limited to such details. Four or more ejector pins may be employed and may be spaced at unevenly angular intervals.

When the holding table 11 is to hold the workpiece 100 under suction on the holding surface 12, the ejector pins 18 are actuated to descend by the pin actuators 19 such that upper ends of the ejector pins 18 have respective heights equal to or smaller than a height of the holding surface 12. When the workpiece 100 is to be unloaded from the holding table 11, the ejector pins 18 are actuated to ascend by the pin actuators 19 such that the upper ends of the ejector pins 18 have respective heights larger than the height of the holding surface 12. When the holding table 11 is to hold the workpiece 100 under suction on the holding surface 12, the ejector pins 18 may be actuated by the pin actuators 19 such that the upper ends of the ejector pins 18 have respective heights different from each other insofar as they are equal to or smaller than the height of the holding surface 12. When the workpiece 100 is to be unloaded from the holding table 11, the ejector pins 18 should preferably be actuated by the pin actuators 19 such that the upper ends of the ejector pins 18 have respective heights equal to each other for lifting the workpiece 100 parallel to the holding surface 12.

As illustrated in FIGS. 1 and 2, the lid 20 includes a casing 2-2. The casing 2-2 defines a space 4-2 therein and has an opening 4-4 through which the space 4-2 is open. The lid 20 is angularly movable by the lid actuator 30 between a closed position 20-1 illustrated in FIG. 1 in which the lid 20 covers the opening 4-3 of the space 4-1 in the housing 10 and an open position 20-2 illustrated in FIG. 2 in which the lid 20 opens the opening 4-3 of the space 4-1 in the housing 10. In a case in which the lid 20 is positioned in the closed position 20-1, the opening 4-4 of the space 4-2 is held in fluid communication with the opening 4-3 of the space 4-1 in the housing 10, and the space 4-2 and the space 4-1 jointly define a hermetically sealed processing space 4. In a case in which the lid 20 is positioned in the open position 20-2, the space 4-2 is separate from the space 4-1 in the housing 10.

When the lid 20 is positioned in the closed position 20-1, a surface of the housing 10 on the opening 4-3 side and a surface of the lid 20 on the opening 4-4 side are opposite each other. Either one of the surface of the housing 10 on the opening 4-3 side and the surface of the lid 20 on the opening 4-4 side that are opposite each other should preferably have a sealing member, not illustrated, that provides a hermetic seal between these surfaces to make the processing space 4 hermetically sealed when the lid 20 is positioned in the closed position 20-1. The sealing member should preferably be an O-ring or the like, for example, that has an increased sealing capability when compressed.

As illustrated in FIGS. 1 and 2, the lid 20 includes an upper table 21 disposed in the space 4-2 in the casing 2-2. In the case in which the lid 20 is positioned in the closed position 20-1, the upper table 21 lies opposite the holding table 11 of the housing 10. The upper table 21 has a flat pressing surface 22. In the case in which the lid 20 is positioned in the closed position 20-1, the pressing surface 22 lies opposite the holding surface 12 of the holding table 11. When the lid 20 is positioned in the closed position 20-1, the pressing surface 22 of the upper table 21 is brought relatively closer to the holding table 11, or specifically, the holding table 11 is pressed toward the pressing surface 22 according to the present embodiment, so that the pressing surface 22 presses and spreads the liquified resin 201, obtained by liquifying the solid resin 200 supplied to the workpiece 100 held on the holding table 11, coating the workpiece 100 with the liquified resin 201. The upper table 21 includes a heating unit 24 such as an electric resistance heater or the like disposed therein that performs a function of heating the upper table 21 to melt the solid resin 200 pressed by the pressing surface 22.

The pressing surface 22 of the upper table 21 for pressing the liquified resin 201 should preferably be coated with a release material for preventing the pressing surface 22 of the upper table 21 and the liquified resin 201 from sticking to each other. The release material to coat the pressing surface 22 should preferably be fluororesin, for example. According to an alternative, a flat resin sheet functioning as a release sheet may be placed in advance on the pressing surface 22, and may be peeled off from the resin 202 after unloading step ST20 to be described later. The resin sheet on the pressing surface 22 should preferably be coated on its surface with a release material.

In the resin coating applying apparatus 1 according to the present embodiment, the holding table 11 includes the heating unit 14 and the upper table 21 includes the heating unit 24. The present invention is not limited to such details. According to the present invention, a heating unit may be included in at least either one of the holding table 11 and the upper table 21 to perform the function of melting the solid resin 200.

The lid actuator 30 operatively couples the housing 10 and the lid 20 to each other, and actuates the lid 20 openably and closably with respect to the housing 10. As illustrated in FIGS. 1 and 2, the lid actuator 30 includes a locus limiter 31 and an actuation controller 32. The locus limiter 31 limits a locus or a path of the lid 20 that is movable relatively to the housing 10. The actuation controller 32 applies actuating forces to the locus limiter 31 to move the lid 20 relatively to the housing 10.

As illustrated in FIGS. 1 and 2, the locus limiter 31 includes a fixed arm 33, a movable arm 34, and a fulcrum point 35. The fixed arm 33 is fixed with respect to the housing 10. Specifically, the fixed arm 33 is fixed to a protrusion 5 protruding horizontally from the frame 3 of the housing 10 and having a bifurcated shape. The fixed arm 33 is erected vertically upwardly on the protrusion 5. The movable arm 34 is fixed with respect to the lid 20. Specifically, the movable arm 34 is erected from a side surface of the casing 2-2 of the lid 20 in an outward direction perpendicular to the side surface of the casing 2-2. The fulcrum point 35 is in the form of a pin extending horizontally by which the movable arm 34 is rotatably coupled to the fixed arm 33 for relative rotation about the pin in a plane perpendicular to the pin. The locus limiter 31 thus limits the locus of the lid 20 with a locus of the movable arm 34 about the pin of the fulcrum point 35.

In the case in which the lid 20 is positioned in the closed position 20-1, the movable arm 34 lies substantially parallel to horizontal directions and forms an angle of substantially 90° at the fulcrum point 35 with the fixed arm 33. In the case in which the lid 20 is positioned in the open position 20-2, the movable arm 34 is oriented nearly vertically and forms an obtuse angle smaller than 180° at the fulcrum point 35 with the fixed arm 33.

Since the locus limiter 31 limits the locus of the lid 20 as described above, the resin coating applying apparatus 1 according to the present embodiment is able to move the lid 20 from the open position 20-2 to the desired closed position 20-1 with higher accuracy.

As illustrated in FIGS. 1 and 2, the actuation controller 32 includes a cylinder 38 that extends and contracts uniaxially for applying actuating forces. The cylinder 38 has an end relatively rotatably coupled with respect to the housing 10 by a fixed fulcrum point 36. Specifically, the end of the cylinder 38 is rotatably coupled by the fixed fulcrum point 36 to a protrusion 6 protruding horizontally from the frame 3 of the housing 10 as with the protrusion 5 and disposed in a central area between the two branches of the bifurcated protrusion 5. The fixed fulcrum point 36 is in the form of a pin extending horizontally by which the cylinder 38 is rotatably coupled to the protrusion 6 for relative rotation about the pin in a plane perpendicular to the pin. The end of the cylinder 38 is thus rotatably coupled essentially to the fixed arm 33 by the fixed fulcrum point 36.

Another end of the cylinder 38 is relatively rotatably coupled to the movable arm 34 by a movable fulcrum point 37. The movable fulcrum point 37 is in the form of a pin extending horizontally by which the cylinder 38 is rotatably coupled to the movable arm 34 for relative rotation about the pin in a plane perpendicular to the pin.

The pin of the fulcrum point 35, the pin of the fixed fulcrum point 36, and the pin of the movable fulcrum point 37 lie parallel to each other. Consequently, the plane in which the movable arm 34 is rotationally moved relatively to the fixed arm 33, the plane in which the cylinder 38 is rotationally moved relatively to the protrusion 6 and the fixed arm 33, and the plane in which the cylinder 38 is rotationally moved relatively to the movable arm 34 lie parallel to each other. Accordingly, when the cylinder 38 extends and contracts and is inclined, as described later, the movable arm 34 is smoothly rotationally moved relatively to the fixed arm 33. According the present embodiment, a clevis fitting should preferably be used as each of the fixed fulcrum point 36 and the movable fulcrum point 37.

When the cylinder 38 extends and contracts, the actuation controller 32 operates to change an angle of tilt of the cylinder 38 with respect to the protrusion 6 thereby to change a distance between the fixed fulcrum point 36 and the movable fulcrum point 37, thereby changing an angle formed between the fixed arm 33 and the movable arm 34 at the fulcrum point 35 of the locus limiter 31 thereby to move the lid 20 relatively to the housing 10. When the cylinder 38 opens and closes the lid 20 by extending and contracting, since the cylinder 38 is rotatably coupled to the fixed arm 33 and the movable arm 34 respectively at the fixed fulcrum point 36 and the movable fulcrum point 37, even though the distance between the fixed fulcrum point 36 and the movable fulcrum point 37 changes, the tilt of the cylinder 38 changes. Consequently, the lid actuator 30 is able to open and close the lid 20 only with the cylinder 38 that extends and contracts.

Specifically, when the cylinder 38 contracts, the actuation controller 32 shortens the distance between the fixed fulcrum point 36 and the movable fulcrum point 37, thereby reducing the angle between the fixed arm 33 and the movable arm 34 at the fulcrum point 35 to move the lid 20 toward the closed position 20-1, and reducing the angle substantially to 90° to position the lid 20 in the closed position 20-1. When the cylinder 38 extends, the actuation controller 32 increases the distance between the fixed fulcrum point 36 and the movable fulcrum point 37, thereby increasing the angle between the fixed arm 33 and the movable arm 34 at the fulcrum point 35 to move the lid 20 toward the open position 20-2, and increasing the angle to the obtuse angle smaller than 180° to position the lid 20 in the open position 20-2.

Since the actuation controller 32 moves the lid 20 within a range limited by the locus limiter 31 upon extension and contraction of the cylinder 38, the resin coating applying apparatus 1 according to the present embodiment prevents the angle between the surface of the lid 20 on the opening 4-4 side and the surface of the housing 10 on the opening 4-3 side from exceeding 90°, thereby allowing the lid 20 to move toward the open position 20-2 with safety and in a space-saving environment.

As illustrated in FIGS. 1 and 2, the resin supply 40 is disposed near the opening 4-3 of the space 4-1 in the housing 10 outside of the housing 10 and the lid 20, and includes a resin tank 41 and a supply nozzle 42. The resin tank 41 stores the solid resin 200 therein. The resin supply 40 supplies the solid resin 200 stored in the resin tank 41 from a supply port 43 of the supply nozzle 42 to the workpiece 100 held on the holding table 11. The supply nozzle 42 is controlled by the control unit 80 to move between a supply position 42-1 illustrated in FIG. 2 in which the supply port 43 is directed toward the holding surface 12 of the holding table 11 for supplying the solid resin 200 to the workpiece 100 held on the holding table 11 and a retracted position 42-2 illustrated in FIG. 1 in which the supply nozzle 42 in its entirety, including the supply port 43, is retracted away from a region above the holding surface 12 of the holding table 11 and the lid 20 is movable to the closed position 20-1.

The solid resin 200 that is supplied from the resin supply 40 may be of any form insofar as it can be supplied through the supply nozzle 42. For example, the solid resin 200 may be of a powder form, a grain form, a tablet form, a block form, a plate form, a sheet form, a doughnut form, a noodle or fiber form, a vortex form, or the like. Among these forms, the grain form is particularly preferable for the solid resin 200 supplied from the resin supply 40 because of the ease with which to handle, transport, and store the solid resin 200, and to adjust a rate at which to supply the solid resin 200.

According to the present embodiment, the solid resin 200 supplied from the resin supply 40 should preferably be a thermoplastic resin. According to the present embodiment, in addition, the solid resin 200 supplied from the resin supply 40 is of a rigid body that is not flowable and essentially not adhesive as is the case with adhesives in a hard state at temperatures lower than its softening point. Therefore, the solid resin 200 is not sticky to the face side 101 of the workpiece 100, etc. In a soft state at temperatures higher than its softening point, the solid resin 200 supplied from the resin supply 40 is flowable but does not essentially exhibit adhesiveness as is the case with adhesives. Therefore, the solid resin 200 is prevented from being sticky to the face side 101 of the workpiece 100, etc.

Specifically, the solid resin 200 supplied from the resin supply 40 may be made of one or two or more materials selected from acrylic resin, methacrylic resin, vinyl-based resin, polyacetal, natural rubber, butyl rubber, isoprene rubber, chloroprene rubber, polyolefin such as polyethylene, polypropylene, poly (4-methyl-1-pentene), poly (1-butene), or the like, polyester such as polyethylene terephthalate, polybutylene terephthalate, or the like, polyamide such as nylon-6, nylon-66, polymethaxylene adipamide, or the like, polyacrylate, polymethacrylate, polyvinyl chloride, polyether imide, polyacrylonitrile, polycarbonate, polystyrene, polysulfone, polyethersulfone, polyphenylene ether, polybutadiene resin, polycarbonate resin, thermoplastic polyimide resin, thermoplastic polyurethane resin, phenoxy resin, polyamide-imide resin, fluororesin, ethylene-unsaturated carboxylic acid copolymer resin, ethylene-vinyl acetate copolymer resin, ionomer, ethylene-vinyl acetate-maleic anhydride terpolymer resin, saponified ethylene-vinyl acetate copolymer resin, ethylene-vinyl alcohol copolymer resin, and the like.

Unsaturated carboxylic acids for use in the ethylene-unsaturated carboxylic acid copolymer resin as the solid resin 200 supplied from the resin supply 40 may include acrylic acid, methacrylic acid, maleic acid, itaconic acid, monomethyl maleate, monoethyl maleate, maleic anhydride, itaconic anhydride, and the like. The ethylene-unsaturated carboxylic acid copolymer includes not only a bipolymer of ethylene and unsaturated carboxylic acid, but also a multi-component copolymer where another monomer is copolymerized. The other monomer that may be copolymerized in the ethylene-unsaturated carboxylic acid copolymer may be, for example, vinyl ester such as vinyl acetate, vinyl propionate, or the like, or unsaturated carboxylic acid ester such as methyl acrylate, ethyl acrylate, isobutyl acrylate, n-butyl acrylate, methyl methacrylate, isobutyl methacrylate, dimethyl maleate, diethyl maleate, or the like.

According to the present embodiment, the softening point of the solid resin 200 supplied from the resin supply 40 is a temperature in a range from 0° C. to 300° C. Since the solid resin 200 supplied from the resin supply 40 is made of a material from the compound group referred to above, its softening point is a temperature in the range from 0° C. to 300° C. The softening point of the solid resin 200 supplied from the resin supply 40 can be adjusted by mixing compounds of different kinds referred to above. For example, the solid resin 200 is prevented from becoming soft during a dry polishing process by adjusting the softening point thereof to a temperature higher than a range from 40° C. to 100° C. that includes a temperature of the workpiece 100 in the dry polishing process.

The solid resin 200 supplied from the resin supply 40 has a melt mass flow rate (MFR) ranging from 0.01 g/10 min to 500 g/10 min, or preferably from 0.1 g/10 min to 100 g/10 min, or more preferably from 0.3 g/10 min to 50 g/10 min at a temperature of 190° C. under a load of 21.18 N among conditions according to a test method of JIS K 7210-1 or 7210-2, for example. Stated otherwise, even in a case in which the solid resin 200 supplied from the resin supply 40 is softened at a high temperature of 190° C. or higher, the solid resin 200 is of a material that is low in flowability and generally does not essentially exhibit adhesiveness as is the case with adhesives, for example.

The solid resin 200 supplied from the resin supply 40 may be mixed with a filler whose coefficient of thermal expansion is smaller than the solid resin 200. The filler mixed with the solid resin 200 supplied from the resin supply 40 should preferably be an inorganic or organic filler whose coefficient of thermal expansion is smaller than the solid resin 200. By being mixed with the filler, the solid resin 200 supplied from the resin supply 40 is able to reduce or prevent thermal expansion or thermal shrinkage that tends to occur when the resin 202 is formed as described later. The workpiece 100 is thus prevented from warping or deformed.

The filler mixed with the solid resin 200 supplied from the resin supply 40 should preferably be an inorganic filler. Specifically, the filler should preferably be made of melted silica, crystalline silica, alumina, calcium carbonate, calcium silicate, barium sulfate, talc, clay, magnesium oxide, aluminum oxide, beryllium oxide, iron oxide, titanium oxide, aluminum nitride, silicon nitride, boron nitride, mica, glass, quartz, isinglass, or the like. The filler mixed with the solid resin 200 supplied from the resin supply 40 may be made of a mixture of two or more of the materials referred to above. The filler mixed with the solid resin 200 supplied from the resin supply 40 should preferably be made of any of silicas such as melted silica, crystalline silica, etc. among the above inorganic fillers, for appropriately minimizing the cost of the filler.

As illustrated in FIGS. 1 and 2, the vacuum pump 50 is disposed outside of the casing 2-1 of the housing 10 and held in fluid communication with the space 4-1 in the housing 10. When the lid 20 is in the closed position 20-1, creating the hermetically sealed processing space 4, the vacuum pump 50 evacuates the space 4-1 to create a vacuum in the hermetically sealed processing space 4. The vacuum referred to is a decompressed state, i.e., a low vacuum, whose pressure is in a range from $10^2$ Pa to $10^5$ $10^2$ Pa, for example, in the hermetically sealed processing space 4. The vacuum pump 50 is a pump for achieving such a low vacuum, preferably a dry pump, a hydraulic rotary pump, or the like, for example.

The resin coating applying apparatus 1 according to the present embodiment is able to reduce and prevent air being caught, i.e., entering and remaining, in the resin 202 and also between the workpiece 100 and the resin 202 by causing the vacuum pump 50 to create a vacuum in the hermetically sealed processing space 4.

As illustrated in FIGS. 1 and 2, the atmospheric vent 60 is disposed outside of the casing 2-2 of the lid 20, and includes an atmospheric vent passage 61 and an atmospheric vent valve 62. The atmospheric vent passage 61 has an end held in fluid communication with the space 4-2 in the lid 20 and another end open into the atmosphere. The atmospheric vent valve 62 that is disposed in the atmospheric vent passage 61 is able to switch between an open state in which the atmospheric vent valve 62 opens the atmospheric vent passage 61 and a closed state in which the atmospheric vent valve 62 closes the atmospheric vent passage 61. When the atmospheric vent valve 62 is in the open state, it brings the space 4-2 in the lid 20 into fluid communication with the atmosphere through the atmospheric vent passage 61. When the atmospheric vent valve 62 is in the closed state, it brings the space 4-2 in the lid 20 out of fluid communication with the atmosphere through the atmospheric vent passage 61.

While the lid 20 is being positioned in the closed position 20-1, creating the hermetically sealed processing space 4, and the hermetically sealed processing space 4 is being evacuated, the atmospheric vent valve 62 is brought into the open state to introduce the atmospheric air into the processing space 4, thereby cooling the resin 202 applied to the workpiece 100 on the holding surface 12 of the holding table 11 in the processing space 4 with the introduced atmospheric air.

As illustrated in FIG. 3, the delivery arm 70 includes a pair of suction pads 71 and a pair of pad actuators 72. The suction pads 71 attract and hold the workpiece 100 under suction. The pad actuators 72 actuate the suction pads 71 to switch between an attracting state in which the suction pads 71 attract the workpiece 100 under suction and a releasing state in which the suction pads 71 release the workpiece 100.

As illustrated in FIGS. 1 through 3, the delivery arm 70 is combined with an actuating mechanism 75 that actuates the delivery arm 70. When the delivery arm 70 with the workpiece 100 attracted under suction by the suction pads 71 is actuated by the actuating mechanism 75, the delivery arm 70 can deliver the workpiece 100. Specifically, the delivery arm 70 can load the workpiece 100 to be coated with the resin 202 onto the holding table 11 and can also unload the workpiece 100 that has been covered with the resin 202 away from the holding table 11.

When the ejector pins 18 are actuated by the pin actuators 19 to unload the workpiece 100 from the holding table 11, a clearance 300 (see FIG. 11) is created by the ejector pins 18 between the lower surface, i.e., the reverse side 102, of the workpiece 100 and the holding surface 12 of the holding table 11. In order for the delivery arm 70 to be inserted into the clearance 300, the delivery arm 70 is thinner in its thicknesswise directions than the height of the ejector pins 18 raised from the holding surface 12 and also than the clearance 300. According to the embodiment illustrated in FIG. 3, the delivery arm 70 is of a forked shape having a pair of branched distal end portions. However, the present invention is not limited to such details. According to the present invention, the delivery arm 70 may be of any shape insofar as it can be inserted into the clearance 300 created by the ejector pins 18 as they are raised, without hitting the ejector pins 18.

According to the embodiment illustrated in FIG. 3, the suction pads 71 are disposed on the branched distal end portions of the delivery arm 70 at two respective locations that are symmetrical with respect to a direction in which the delivery arm 70 extends. However, the present invention is not limited to such details. According to the present invention, insofar as the suction pads 71 are able to attract and hold the workpiece 100 under suction that are lifted by the ejector pins 18, the suction pads 71 may be disposed in one location, three or more locations, or asymmetrical locations on the delivery arm 70.

The control unit 80 controls various components of the resin coating applying apparatus 1 to enable the resin coating applying apparatus 1 to perform various processing operations to coat the workpiece 100 with the resin 202.

According to the present embodiment, the control unit 80 includes a computer system. The control unit 80 includes an arithmetic processing apparatus having a microprocessor such as a central processing unit (CPU), a storage apparatus having a memory such as a read only memory (ROM) or a random access memory (RAM), and an input/output interface apparatus. The arithmetic processing apparatus carries out arithmetic processing operations according to computer programs stored in the storage apparatus to generate and output control signals for controlling the resin coating applying apparatus 1 through the input/output interface apparatus to the various components of the resin coating applying apparatus 1.

Figure 4:
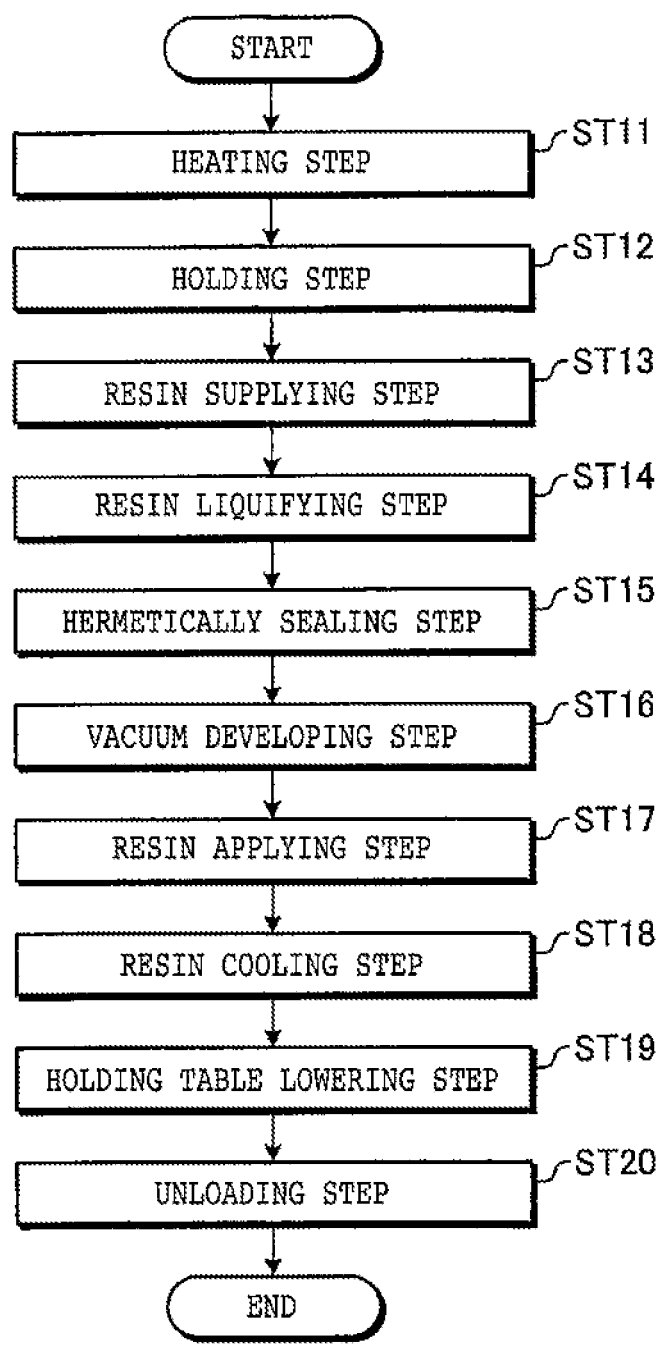
FIG. 4 is a flowchart of a method of applying a resin coating according to the embodiment.

Next, the method of applying a resin coating according to the present embodiment, which is an example of an operation sequence of the resin coating applying apparatus 1, will be described below. FIG. 4 is a flowchart of the method of applying a resin coating according to the present embodiment.

The method of applying a resin coating according to the present embodiment is a method of coating the workpiece 100 with the resin 202 using the resin coating applying apparatus 1 according to the present embodiment. As illustrated in FIG. 4, the method includes a heating step ST11, a holding step ST12, a resin supplying step ST13, a resin liquifying step ST14, a hermetically sealing step ST15, a vacuum developing step ST16, a resin applying step ST17, a resin cooling step ST18, a holding table lowering step ST19, and an unloading step ST20.

FIG. 5 illustrates in cross section by way of example the heating step ST11, the holding step ST12, and the resin supplying step ST13 illustrated in FIG. 4. The method of applying a resin coating according to the present embodiment starts when the lid 20 is positioned in the open position 20-2 and both the space 4-1 in the housing 10 and the space 4-2 in the lid 20 are vented to the atmosphere.

As illustrated in FIG. 5, the heating step ST11 is a step in which the heating unit 14 heats the holding table 11. According to the present embodiment, in the heating step ST11, as the holding table 11 incorporates the heating unit 14 therein, the control unit 80 energizes the heating unit 14 to heat the holding table 11. Alternatively, the holding table 11 may be devoid of the heating unit 14 and the upper table 21 may incorporate the heating unit 24 for carrying out the heating step ST11. Such an alternative structure will be described later with reference to a second modification.

As illustrated in FIG. 5, the holding step ST12 is a step in which the holding table 11 holds the workpiece 100 thereon. In the holding step ST12, specifically, the control unit 80 operates the actuating mechanism 75 to cause the delivery arm 70 to load and supply the workpiece 100 through the opening 4-3 into the space 4-1 in the housing 10 and place the workpiece 100 onto the holding surface 12 of the holding table 11. In the holding step ST12, then, the control unit 80 operates the suction source 16-1 to generate and apply a negative pressure through the fluid communication channel 16-2 and the suction grooves 17 to the holding surface 12, which holds the placed workpiece 100 under suction thereon.

In the method of applying a resin coating according to the present embodiment, the face side 101 of the workpiece 100 is coated with the resin 202. Therefore, in the holding step ST12, the workpiece 100 is held on the holding surface 12 with the face side 101 directed toward the opening 4-3 and the reverse side 102 directed toward the holding surface 12. However, the present invention is not limited to such details. According to the present invention, in the case in which the reverse side 102 of the workpiece 100 is coated with the resin 202, the workpiece 100 is held on the holding surface 12 with the reverse side 102 directed toward the opening 4-3 and the face side 101 directed toward the holding surface 12 in the holding step ST12.

The resin supplying step ST13 is carried out after at least the holding step ST12. As illustrated in FIG. 5, the resin supplying step ST13 is a step in which the resin supply 40 supplies the solid resin 200 onto the upper surface, i.e., the face side 101, of the workpiece 100 that has been held on the holding table 11 in the holding step ST12. In the resin supplying step ST13, specifically, the control unit 80 positions the supply nozzle 42 of the resin supply 40 in the supply position 42-1. In the resin supplying step ST13, then, the resin supply 40 supplies the solid resin 200 stored in the resin tank 41 from the supply port 43 of the supply nozzle 42 onto the face side 101 as the upper surface of the workpiece 100 held on the holding table 11.

According to the present embodiment, in the resin supplying step ST13, the resin supply 40 supplies one or more particles of the solid resin 200 in the grain form. In the resin supplying step ST13, it is preferable for the resin supply 40 to supply the solid resin 200 so as to be widely distributed over the face side 101 of the workpiece 100. According to the present embodiment illustrated in FIG. 5, in the resin supplying step ST13, the resin supply 40 supplies seven particles of the solid resin 200 onto the workpiece 100. However, the present invention is not limited to such details. According to the present invention, the resin supply 40 may supply particles of the solid resin 200 that range from one to six particles or from eight particles or more onto the workpiece 100.

In a case in which the face side 101 of the workpiece 100 has surface irregularities, the solid resin 200 to be supplied in the resin supplying step ST13 is placed over and across one or more surface irregularities. Furthermore, in the case in which the face side 101 of the workpiece 100 has surface irregularities, the solid resin 200 to be supplied in the resin supplying step ST13 has such a volume that it can cover the surface irregularities over the entire face side 101 of the workpiece 100. Stated otherwise, the solid resin 200 to be supplied in the resin supplying step ST13 has such a volume that it can form a layer covering the face side 101 uninterruptedly and thicker than the surface irregularities of the face side 101 in the resin applying step ST17 to be described later.

According to the present embodiment, the heating step ST11, the holding step ST12, and the resin supplying step ST13 are successively carried out in the order named. However, the present invention is not limited to such details. According to the present invention, providing that the resin supplying step ST13 is carried out after at least the holding step ST12, the heating step ST11, the holding step ST12, and the resin supplying step ST13 may be carried out concurrently.

Figure 6:
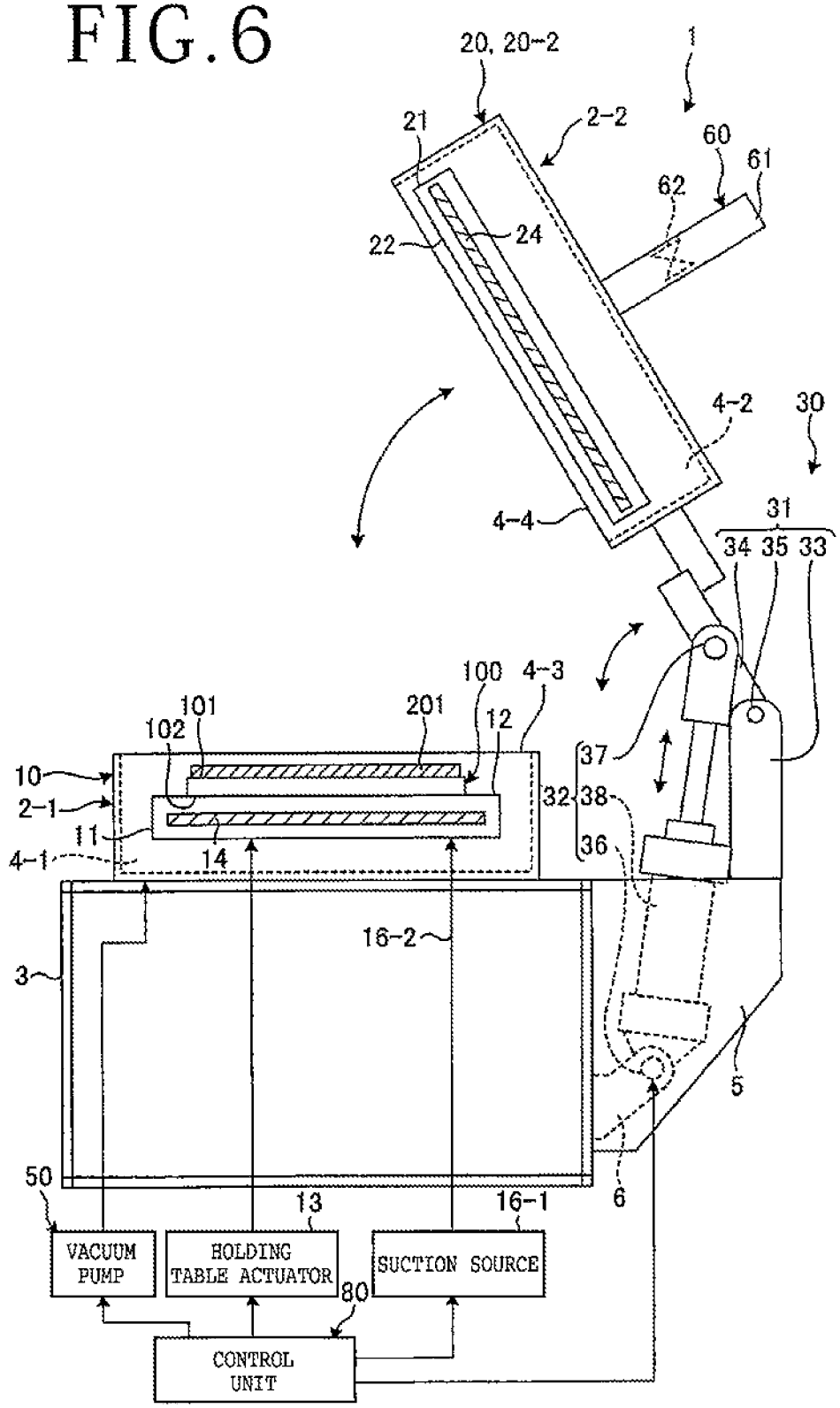
FIG. 6 is a cross-sectional view illustrating by way of example a resin liquifying step in FIG. 4.

FIG. 6 illustrates in cross section by way of example the resin liquifying step ST14 illustrated in FIG. 4. The resin liquifying step ST14 is carried out after the heating step ST11, the holding step ST12, and the resin supplying step ST13. As illustrated in FIG. 6, the resin liquifying step ST14 is a step in which the heated holding table 11 liquifies the solid resin 200. In the resin liquifying step ST14, specifically, the holding table 11 that has been heated in the heating step ST11 heats the solid resin 200 supplied in the resin supplying step ST13 through the workpiece 100 held in the holding step ST12, melting the solid resin 200 into the liquified resin 201, i.e., a resin in a liquid phase. Stated otherwise, the resin coating applying apparatus 1 according to the present embodiment carries out the resin liquifying step ST14 to form the liquified resin 201 on the face side 101 as the upper surface of the workpiece 100, as illustrated in FIG. 6.

Figure 7:
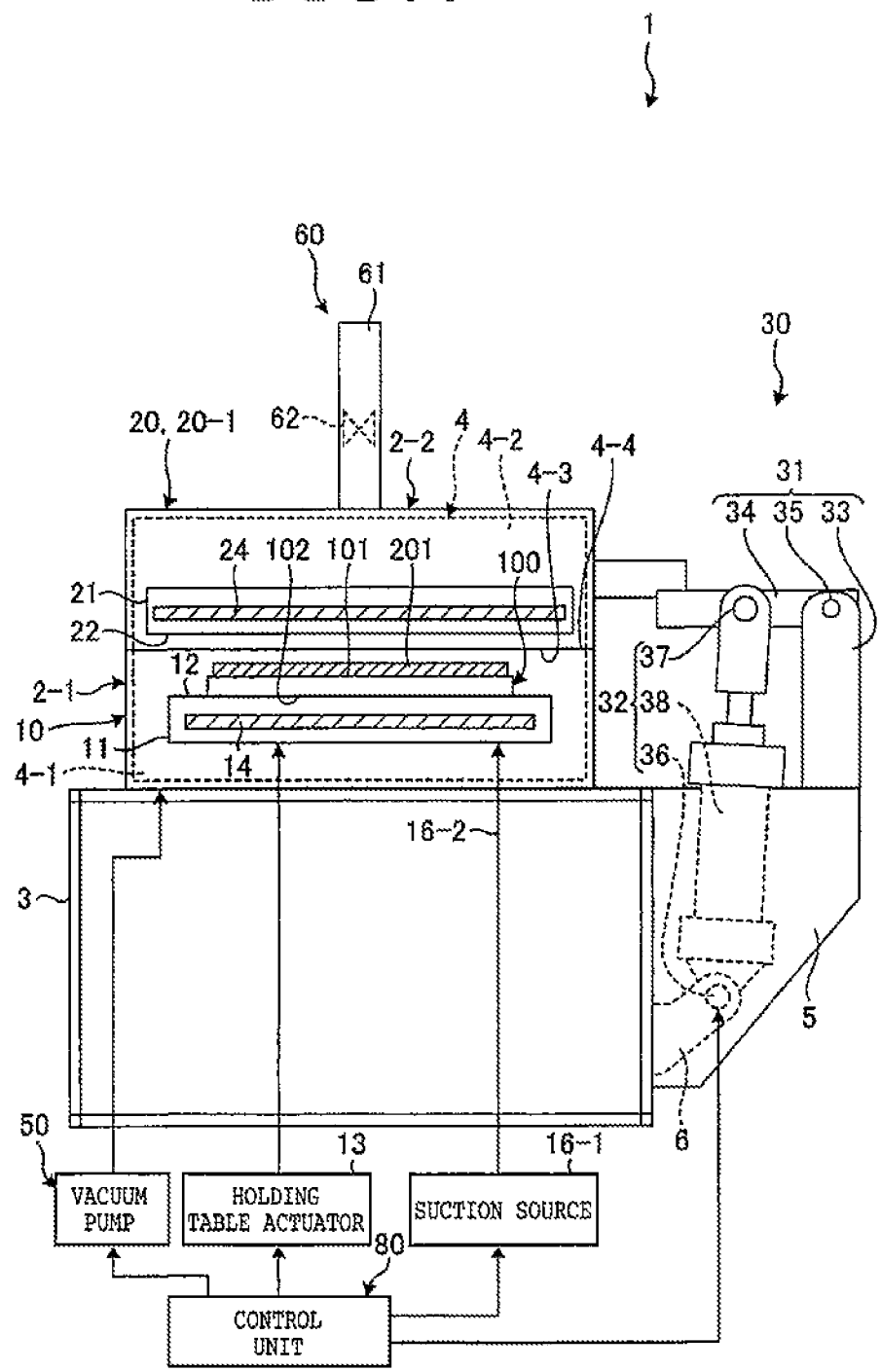
FIG. 7 is a cross-sectional view illustrating by way of example a hermetically sealing step and a vacuum applying step in FIG. 4.

FIG. 7 illustrates in cross section by way of example the hermetically sealing step ST15 and the vacuum developing step ST16 illustrated in FIG. 4. the hermetically sealing step ST15 is carried out after at least the holding step ST12 and the resin supplying step ST13. As illustrated in FIG. 7, the hermetically sealing step ST15 is a step in which the lid 20 is closed over the opening 4-3 in the housing 10 and the housing 10 and the lid 20 jointly define the hermetically sealed processing space 4 therein. In the hermetically sealing step ST15, specifically, the control unit 80 operates the lid actuator 30 to turn the lid 20 from the open position 20-2 to the closed position 20-1, causing the surface of the lid 20 on the opening 4-4 side and the surface of the housing 10 on the opening 4-3 side to mate with each other and bringing the opening 4-4 in the lid 20 and the opening 4-3 in the housing 10 into fluid communication with each other, whereupon the hermetically sealed processing space 4 including the space 4-2 and the space 4-1 is formed.

The vacuum developing step ST16 is carried out after at least the hermetically sealing step ST15. As illustrated in FIG. 7, the vacuum developing step ST16 is a step in which the vacuum pump 50 develops a vacuum in the processing space 4 formed in the hermetically sealing step ST15. In the vacuum developing step ST16, specifically, the control unit 80 operates the vacuum pump 50 to evacuate the hermetically sealed processing space 4.

In the vacuum developing step ST16, the inside of the processing space 4 changes from the atmospheric pressure to the vacuum state. Therefore, since a difference between the negative pressure applied from the suction source 16-1 to the holding surface 12 and the vacuum developed in the processing space 4 becomes lower in the vacuum developing step ST16, the holding table 11 switches to a state in which it holds the workpiece 100 on the holding surface 12 under a weaker suction force than when the inside of the processing space 4 is the atmospheric pressure.

Figure 8:
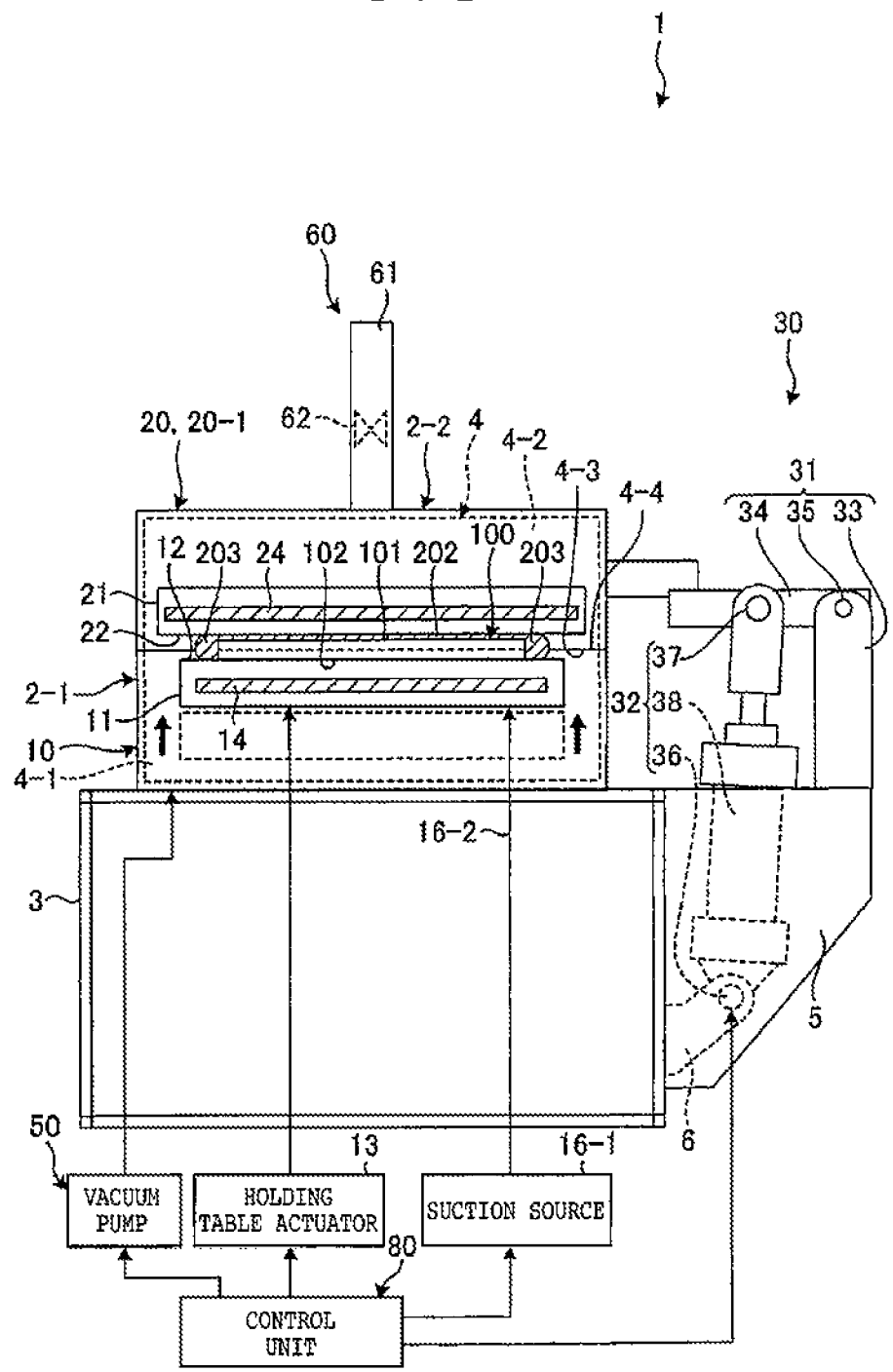
FIG. 8 is a cross-sectional view illustrating by way of example a resin coating applying step in FIG. 4.

FIG. 8 illustrates in cross section by way of example the resin applying step ST17 illustrated in FIG. 4. The resin applying step ST17 is a step, carried out after the vacuum developing step ST16, in which the holding table 11 is elevated to spread the liquified resin 201 between itself and the upper table 21 to coat the workpiece 100 with the liquified resin 201.

In the resin applying step ST17, specifically, as the holding table 11 is combined with the holding table actuator 13, the control unit 80 operates the table actuator 13 to move the holding table 11 upwardly in FIG. 8 toward the upper table 21. In the resin applying step ST17, therefore, the holding surface 12 of the holding table 11 and the pressing surface 22 of the upper table 21 that are opposite each other are brought closely to each other to bring the liquified resin 201 on the face side 101 of the workpiece 100 on the holding surface 12 and the pressing surface 22 of the upper table 21 closely to each other.

In the resin applying step ST17, furthermore, the holding table actuator 13 continues to move the holding table 11 toward the upper table 21 until the pressing surface 22 of the upper table 21 contacts the liquified resin 201 on the face side 101 of the workpiece 100 on the holding surface 12. In the resin applying step ST17, as the upper table 21 includes the heating unit 24, the control unit 80 energizes the heating unit 24 to heat the liquified resin 201 contacted by the pressing surface 22.

In the resin applying step ST17, then, the flat pressing surface 22 of the upper table 21 presses the liquified resin 201 on the face side 101 of the workpiece 100, deforming and spreading the liquified resin 201 along the pressing surface 22 and the face side 101 of the workpiece 100. In the resin applying step ST17, therefore, as illustrated in FIG. 8, the liquified resin 201 is turned into the resin 202 covering the face side 101 of the workpiece 100 between the pressing surface 22 and the face side 101 of the workpiece 100. In the resin applying step ST17, a surface of the resin 202 that is pressed by the pressing surface 22 is made flatwise along the pressing surface 22 and becomes an exposed surface of the resin 202.

Since the resin applying step ST17 is carried out after the vacuum developing step ST16, the resin applying step ST17 is carried out in the evacuated processing space 4. Consequently, in the resin applying step ST17, it is possible to reduce and prevent air being caught in the liquified resin 201 and also between the workpiece 100 and the liquified resin 201, and hence to reduce and prevent air being caught in the resin 202 and also between the workpiece 100 and the resin 202.

Figure 9:
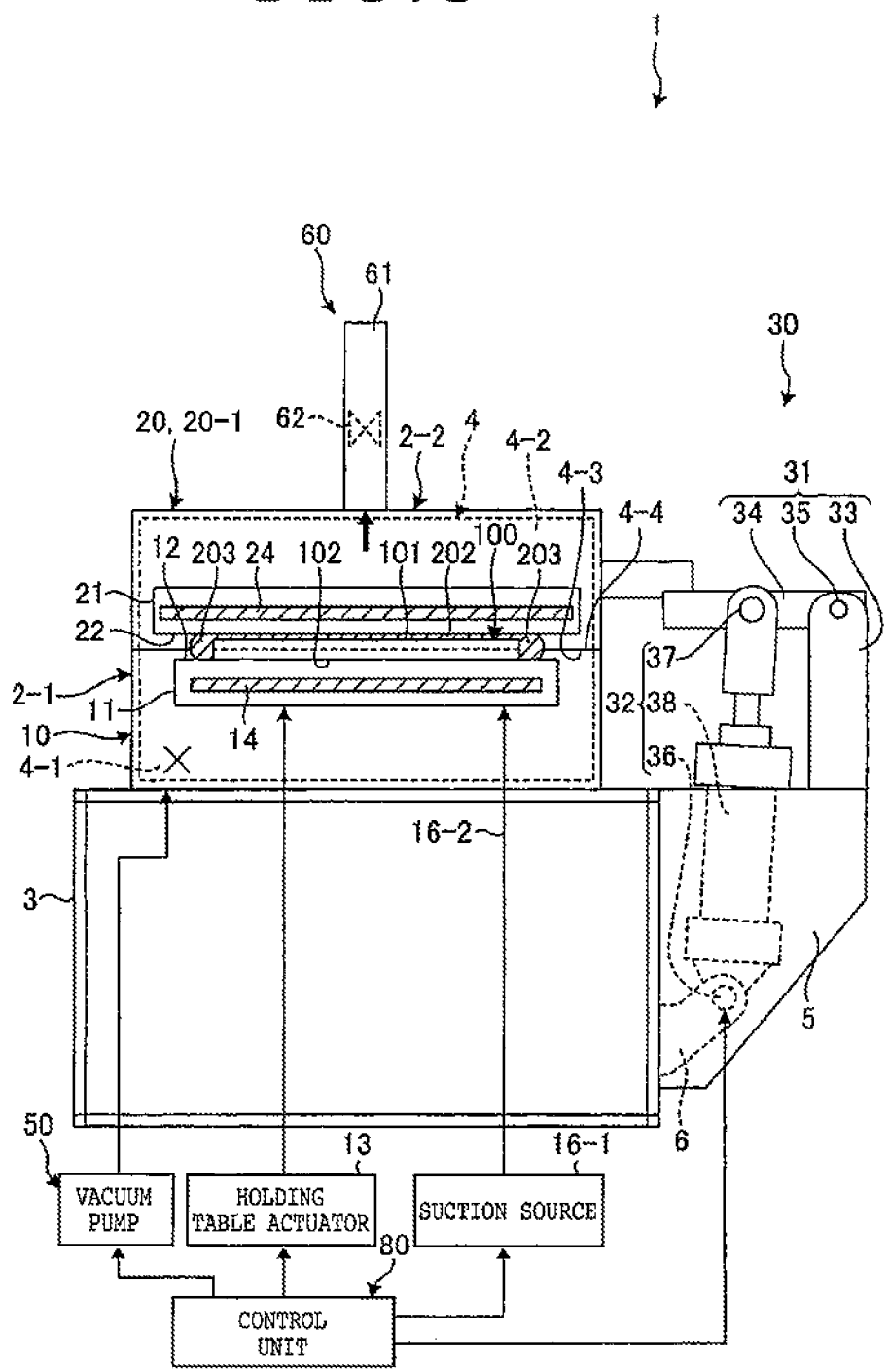
FIG. 9 is a cross-sectional view illustrating by way of example a resin cooling step in FIG. 4.

FIG. 9 illustrates in cross section by way of example the resin cooling step ST18 illustrated in FIG. 4. The resin cooling step ST18 is a step, carried out after the resin applying step ST17, in which, as illustrated in FIG. 9, the holding table 11 stops being heated while being elevated, and the atmospheric air is introduced from the atmospheric vent passage 61 through the atmospheric vent valve 62 into the processing space 4 to cool and harden the resin 202.

In the resin cooling step ST18, first, the control unit 80 de-energizes the heating unit 14 of the holding table 11 and the heating unit 24 of the upper table 21, thereby stopping heating the resin 202. In the resin cooling step ST18, then, the control unit 80 stops operating the vacuum pump 50 to stop evacuating the hermetically sealed processing space 4. In the resin cooling step ST18, next, the control unit 80 controls the atmospheric vent valve 62 of the atmospheric vent 60 to switch from the closed state to the open state, introducing the atmospheric air into the processing space 4. In the resin cooling step ST18, the atmospheric air introduced from the atmospheric vent 60 into the processing space 4 cools the resin 202 applied to the workpiece 100 on the holding surface 12 of the holding table 11.

Specifically, the resin cooling step ST18 is carried out while the holding surface 12 of the holding table 11 and the pressing surface 22 of the upper table 21 that are opposite each other have been brought closely to each other in the resin applying step ST17. Therefore, in the resin cooling step ST18, the resin 202 is kept as a layer and hardened along the pressing surface 22 and the face side 101 of the workpiece 100 that have been brought closely to each other.

In the resin cooling step ST18, furthermore, the inside of the processing space 4 changes from the vacuum state to the atmospheric pressure. Therefore, since the difference between the negative pressure applied from the suction source 16-1 to the holding surface 12 and the atmospheric pressure in the processing space 4 becomes higher in the resin cooling step ST18, the holding table 11 switches to a state in which it holds the workpiece 100 on the holding surface 12 under a stronger suction force.

In the resin cooling step ST18, in a case in which the holding table 11 or the upper table 21 includes therein a cooling mechanism using a water flow or a cooling mechanism using a cooling plate having a high thermal conductivity or thermal capacity, the cooling mechanism may be operated concurrent with the introduction of the atmospheric air into the processing space 4 to cool the resin 202 quickly.

Figure 10:
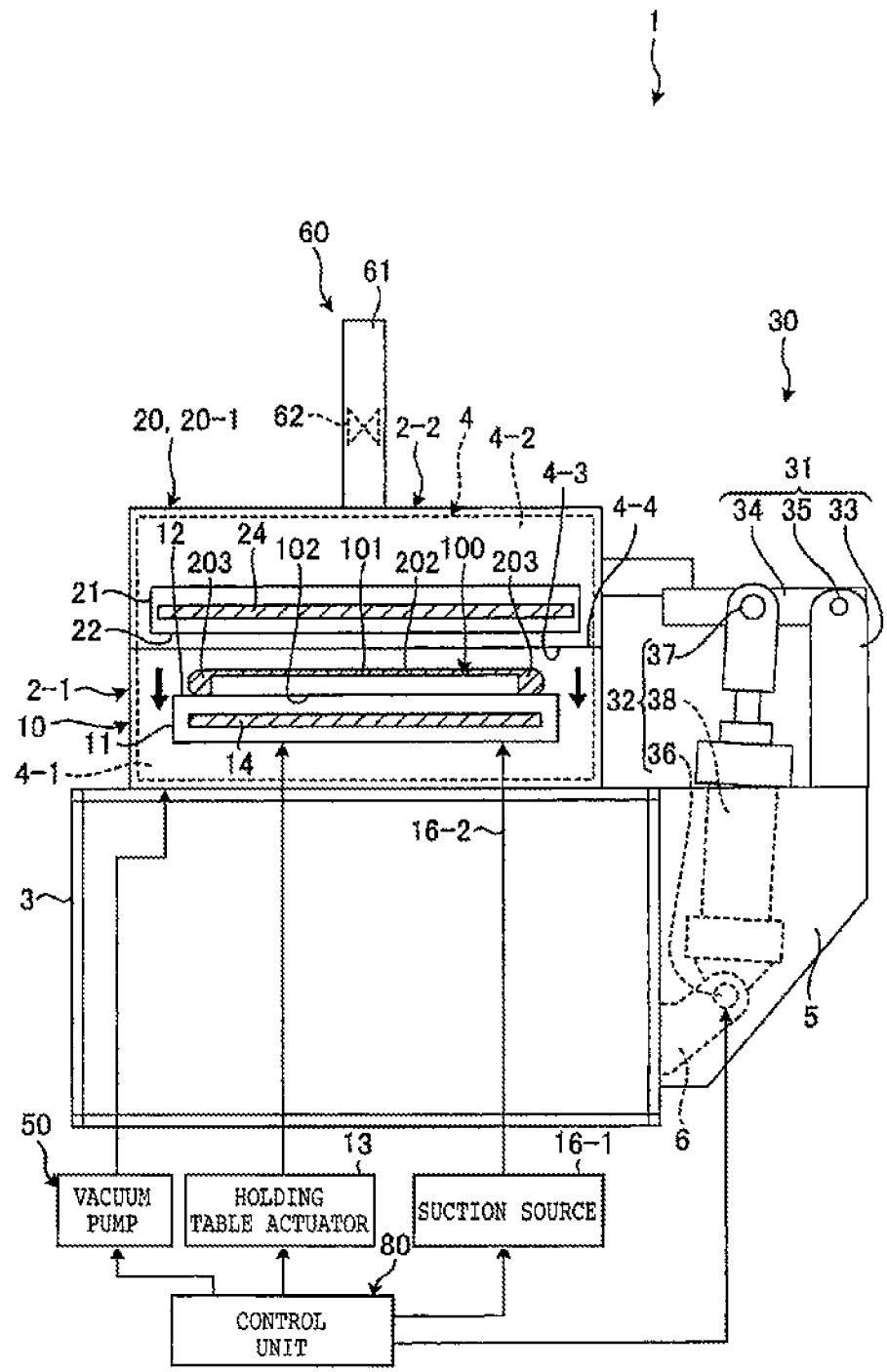
FIG. 10 is a cross-sectional view illustrating by way of example a holding table lowering step in FIG. 4.

FIG. 10 illustrates in cross section by way of example the holding table lowering step ST19 illustrated in FIG. 4. The holding table lowering step ST19 is carried out after the resin cooling step ST18. As illustrated in FIG. 10, the holding table lowering step ST19 is a step in which the holding table 11 that is holding the workpiece 100 under suction is lowered.

In the holding table lowering step ST19, specifically, inasmuch as the holding table 11 has switched to the state in which it holds the workpiece 100 on the holding surface 12 under the stronger suction force in the resin cooling step ST18, the holding table 11 keeps holding the workpiece 100 under the stronger suction force, and the control unit 80 operates the holding table actuator 13 to move the holding table 11 downwardly in FIG. 10 away from the upper table 21. Consequently, as illustrated in FIG. 10, the workpiece 100 coated with the resin 202 remains under suction on the holding surface 12 and is spaced from the pressing surface 22 of the upper table 21 in the holding table lowering step ST19.

Figure 11:
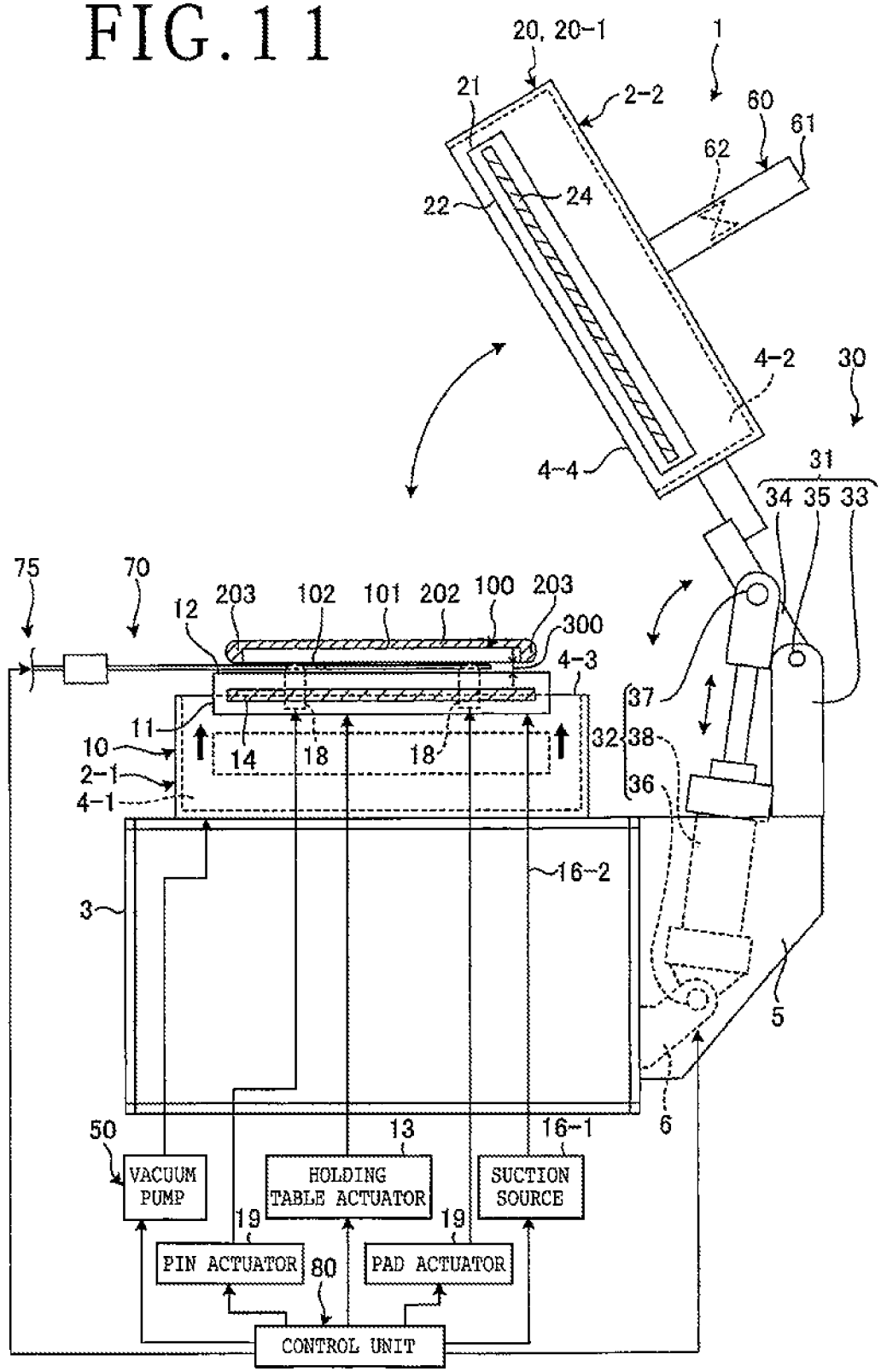
FIG. 11 is a cross-sectional view illustrating by way of example an unloading step in FIG. 4.

FIG. 11 illustrates in cross section by way of example the unloading step ST20 illustrated in FIG. 4. The unloading step ST20 is carried out after the holding table lowering step ST19. As illustrated in FIG. 11, the unloading step ST20 is a step in which the lid 20 is opened and the workpiece 100 coated with the resin 202 is unloaded from the holding table 11.

In the unloading step ST20, specifically, the control unit 80 operates the lid actuator 30 to turn the lid 20 from the closed position 20-1 to the open position 20-2, separating the processing space 4 into the space 4-2 and the space 4-1. The unloading step ST20 is carried out in the state after the holding table lowering step ST19, i.e., in the state in which the workpiece 100 coated with the resin 202 is spaced from the pressing surface 22 of the upper table 21. In the unloading step ST20, therefore, the lid actuator 30 turns only the lid 20 including the upper table 21 and the atmospheric vent 60 from the closed position 20-1 to the open position 20-2, leaving the workpiece 100 coated with the resin 202 on the holding surface 12 of the holding table 11.

In the unloading step ST20, thereafter, the ejector pins 18 and the pin actuator 19 of the holding table 11 are operated to make the workpiece 100 coated with the resin 202 ready to be unloaded by the delivery arm 70, and the delivery arm 70 unloads the workpiece 100 from the holding table 11.

In the unloading step ST20, specifically, the control unit 80 operates the pin actuator 19 to move the ejector pins 18 to a position in which the upper ends thereof are higher than the holding surface 12. In the unloading step ST20, therefore, the ejector pins 18 lift the reverse side 102 of the workpiece 100 upwardly away from the holding surface 12, creating the clearance 300 between the lower surface, i.e., the reverse side 102, of the workpiece 100 and the holding surface 12 of the holding table 11.

In the unloading step ST20, concurrent with the upward movement of the ejector pins 18 by the pin actuator 19, the control unit 80 operates the holding table actuator 13 to lift the holding table 11 to move the holding surface 12 thereof to a height higher than the opening 4-3 in the housing 10. In the unloading step ST20, therefore, since the clearance 300 is positioned at a height higher than the opening 4-3 in the housing 10, the delivery arm 70 can be inserted sideways into the clearance 300.

In the unloading step ST20, thereafter, the control unit 80 operates the actuating mechanism 75 to insert the delivery arm 70 into the clearance 300 created by the ejector pins 18 between the lower surface, i.e., the reverse side 102, of the workpiece 100 and the holding surface 12 of the holding table 11. In the unloading step ST20, the actuating mechanism 75 slowly elevates the delivery arm 70 inserted in the clearance 300 into contact with the reverse side 102 of the workpiece 100 coated with the resin 202. In the unloading step ST20, the control unit 80 operates the pad actuator 72 to change the suction pads 71 on the delivery arm 70 that has contacted the reverse side 102 of the workpiece 100 coated with the resin 202, from the releasing state to the attracting state, thereby enabling the delivery arm 70 to hold the workpiece 100 coated with the resin 202. In the unloading step ST20, the actuating mechanism 75 turns the delivery arm 70 that is holding the workpiece 100 coated with the resin 202 from above the holding table 11, thereby unloading the workpiece 100 coated with the resin 202 from the holding table 11.

In the resin applying step ST17, the face side 101, i.e., the upper surface, of the workpiece 100 is coated with the resin 202, and in the unloading step ST20, the reverse side 102, i.e., the lower surface, of the workpiece 100 is attracted under suction by the suction pads 71 on the delivery arm 70, and the workpiece 100 is unloaded by the delivery arm 70. Consequently, the resin coating applying apparatus 1 and the method of applying a resin coating according to the present embodiment are capable of unloading the workpiece 100 without contacting the resin 202 that has been freshly applied to the workpiece 100.

Figure 12:
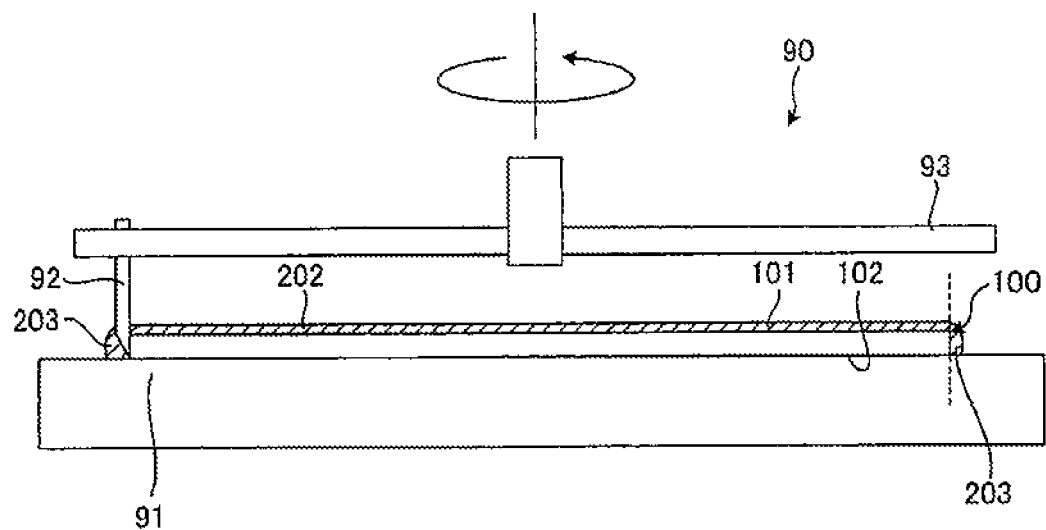
FIG. 12 is a cross-sectional view illustrating by way of example an excessive portion cutting-off step of the method of applying a resin coating according to the embodiment.

FIG. 12 illustrates in cross section by way of example an excessive portion cutting-off step of the method of applying a resin coating according to the present embodiment. The method of applying a resin coating according to the present embodiment may have an excessive portion cutting-off step, carried out after the unloading step ST20, in which an excessive portion 203 of the resin 202 that projects radially outwardly from the workpiece 100 is cut off, as illustrated in FIG. 12.

In the excessive portion cutting-off step, specifically, a cutter 92 of a cutting apparatus 90 cuts off the excessive portion 203 of the resin 202 on the workpiece 100 held on the holding table 11 as illustrated in FIG. 12. The cutting apparatus 90 includes a disk 93 that supports the cutter 92 thereon such that the cutter 92 is directed to an outer circumferential edge of the workpiece 100, and a rotary actuator, not illustrated, for rotating the disk 93 about its central axis. When the rotary actuator rotates the disk 93 about its central axis, the cutter 92 rotates along the outer circumferential edge of the workpiece 100 in cutting engagement therewith, cutting off the excessive portion 203 that projects radially outwardly from the workpiece 100.

The resin coating applying apparatus 1 according to the present embodiment carries out the above method of applying a resin coating according to the present embodiment to obtain the workpiece 100 coated with the resin 202.

As described above, the resin coating applying apparatus 1 according to the present embodiment includes the housing 10 that houses the holding table 11 for holding and pressing the reverse side 102, the lower surface, of the workpiece 100 under suction, the lid 20 that houses the upper table 21 for pressing the solid resin 200 supplied to the face side 101, i.e., the upper surface, of the workpiece 100, and the vacuum pump 50 for evacuating the hermetically sealed processing space 4 that is defined when the lid 20 covers the opening 4-3 in the housing 10. In the resin coating applying apparatus 1 according to the present embodiment, the resin supply 40 supplies the solid resin 200 to the face side 101 of the workpiece 100, the heating unit 14 in the holding table 11 and the heating unit 24 in the upper table 21 heat and melt the solid resin 200 into the liquified resin 201, and the holding table 11 and the upper table 21 spread the liquified resin 201 into the resin 202 that coats the workpiece 100. The solid resin 200 supplied from the resin supply 40 is easier to handle than a resin in a liquid phase, is not bulky as it is solid, and hence does not take man-hours to transport and store. On the other hand, the solid resin 200 supplied from the resin supply 40 tends to trap therein ambient air and gases as air and gas bubbles when it is solidified.

The resin coating applying apparatus 1 according to the present embodiment coats the workpiece 100 with the resin 202 using the solid resin 200, i.e., produced from the solid resin 200, in the hermetically sealed processing space 4 evacuated by the vacuum pump 50. Therefore, the resin coating applying apparatus 1 according to the present embodiment is advantageous in that air and gases trapped in the solid resin 200 can be removed, and hence it is possible to reduce and prevent air being caught in the liquified resin 201 and also between the workpiece 100 and the liquified resin 201. Consequently, the resin coating applying apparatus 1 according to the present embodiment is advantageous in that it makes it possible to reduce and prevent air being caught in the resin 202 and also between the workpiece 100 and the resin 202. As described above, the resin coating applying apparatus 1 according to the present embodiment is advantageous in that it is able to appropriately coat the workpiece 100 with the resin 202 using the solid resin 200.

In the method of applying a resin coating according to the present embodiment, the processing space 4 is evacuated by the vacuum pump 50 in the vacuum developing step ST16, and thereafter the workpiece 100 is coated with the resin 202 using the solid resin 200 in the evacuated processing space 4 in the resin applying step ST17. The method of applying a resin coating according to the present embodiment is thus as advantageous as the resin coating applying apparatus 1 according to the present embodiment.

The resin coating applying apparatus 1 according to the present embodiment also includes the lid actuator 30 having the locus limiter 31 for limiting the locus or path of the lid 20 and the actuation controller 32 for moving the lid 20 in a limiting range of the locus limiter 31 by extending and contracting the cylinder 38. Therefore, the resin coating applying apparatus 1 according to the present embodiment is capable of moving the lid 20 from the open position 20-2 to the desired closed position 20-1 with higher accuracy, and of preventing the angle between the surface of the lid 20 on the opening 4-4 side and the surface of the housing 10 on the opening 4-3 side from exceeding 90°, thereby allowing the lid 20 to move toward the open position 20-2 with safety and in a space-saving environment.

The resin coating applying apparatus 1 according to the present embodiment further includes the delivery arm 70 for unloading the workpiece 100 from the holding table 11, the delivery arm 70 having the suction pads 71 for holding the workpiece 100 and the pad actuators 72 for actuating the suction pads 71. In the resin coating applying apparatus 1 according to the present embodiment, the holding table 11 includes the holding surface 12 for holding the workpiece 100 thereon, the suction grooves 17 defined in the holding surface 12, and the fluid communication channel 16-2 providing fluid communication between the suction grooves 17 and the suction source 16-1. The holding table 11 also includes the three or more ejector pins 18 on the holding surface 12 and the three or more pin actuators 19 for moving the respective ejector pins 18 upwardly and downwardly. In the resin coating applying apparatus 1 according to the present embodiment, when the holding table 11 is to hold the workpiece 100 under suction on the holding surface 12, the upper ends of the ejector pins 18 have respective heights equal to or smaller than the height of the holding surface 12. When the workpiece 100 is to be unloaded from the holding table 11, the upper ends of the ejector pins 18 have respective heights larger than the height of the holding surface 12, and the delivery arm 70 is inserted into the clearance 300 created by the ejector pins 18 between the workpiece 100 and the holding table 11 and delivers the workpiece 100 from the holding table 11. The resin coating applying apparatus 1 according to the present embodiment is thus capable of unloading the workpiece 100 without contacting the resin 202 that has been freshly applied to the workpiece 100.

The resin coating applying apparatus 1 and the method of applying a resin coating according to the present embodiment are also advantageous in that unlike adhesive layers used on adhesive tapes, the resin 202 generally does not essentially exhibit adhesiveness as is the case with adhesives, and is solidified when cooled, essentially exhibiting no adhesiveness. Therefore, the resin coating applying apparatus 1 and the method of applying a resin coating according to the present embodiment are also advantageous in that when the resin 202 is peeled off from the workpiece 100, it does not leave residuals on the workpiece 100. Furthermore, the resin coating applying apparatus 1 and the method of applying a resin coating according to the present embodiment are also advantageous in that unlike adhesive tapes that have heretofore been used as protective members, the resin 202 has no prescribed thickness, but can be formed to a desired thickness depending on the amount of the supplied solid resin 200 and the amount of the pressure applied to spread the solid resin 200, so that it is not necessary to increase the number of kinds of solid resins 200 ready to be used, and it is possible to reduce the number of man-hours required to transport and store the solid resin 200, resulting in a reduction in the cost of the solid resin 200.

[First Modification]

Figure 13:
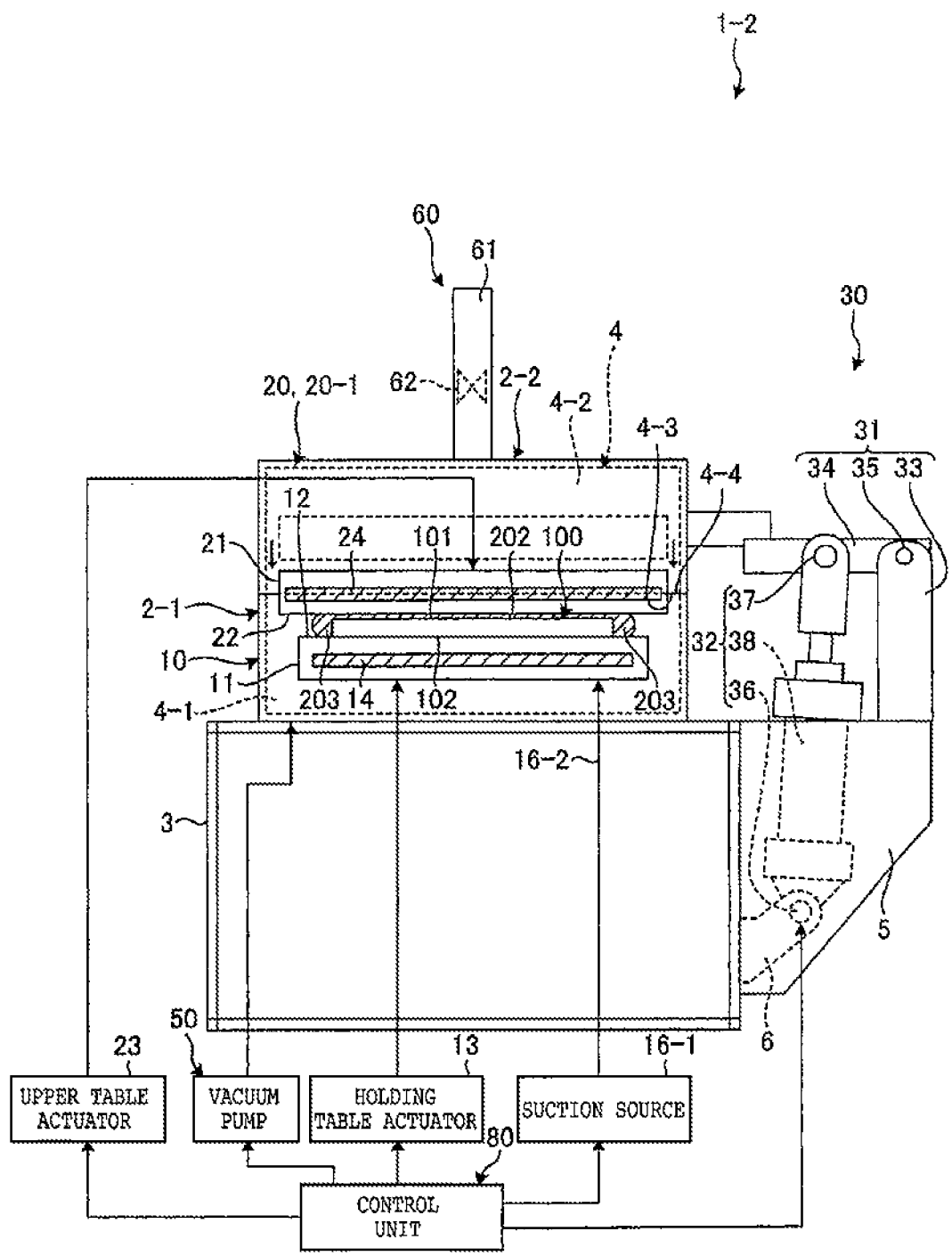
FIG. 13 is a cross-sectional view of a resin coating applying apparatus according to a first modification of the embodiment, illustrating the resin coating applying apparatus in a state.

A resin coating applying apparatus 1-2 and a method of applying a resin coating according to a first modification of the embodiment of the present invention will be described below with reference to the drawings. FIG. 13 illustrates in cross section the resin coating applying apparatus 1-2 according to the first modification of the embodiment, illustrating the resin coating applying apparatus 1-2 in a state. In FIG. 13, those parts which are identical to those according to the embodiment are denoted by identical reference symbols, and their description will be omitted below.

The resin coating applying apparatus 1-2 according to the first modification is different from the resin coating applying apparatus 1 according to the embodiment in that it further includes an upper table actuator 23 for moving the upper table 21 in directions perpendicular to the pressing surface 22, as illustrated in FIG. 13. Other structural details of the resin coating applying apparatus 1-2 according to the first modification are the same as those of the resin coating applying apparatus 1 according to the embodiment. The method of applying a resin coating according to the first modification is different from the method of applying a resin coating according to the embodiment in that the resin applying step ST17 is changed and the holding table lowering step ST19 is replaced with an upper table lifting step.

In the method of applying a resin coating according to the first modification, the resin applying step ST17 is a step, carried out after the vacuum developing step ST16, in which, as illustrated in FIG. 13, the upper table 21 is lowered to spread the liquified resin 201 between itself and the holding table 11 to coat the workpiece 100 with the liquified resin 201.

The resin applying step ST17 according to the first modification is different from the resin applying step ST17 according to the embodiment in that instead of operating the holding table actuator 13 to move the holding table 11 closely to and into contact with the upper table 21, the control unit 80 operates the upper table actuator 23 to move the upper table 21 closely to and into contact with the holding table 11, thereby pressing the holding table 11. Other processing details of the resin applying step ST17 according to the first modification are the same as those of the resin applying step ST17 according to the embodiment.

In the method of applying a resin coating according to the first modification, the upper table lifting step is a step, carried out instead of the holding table lowering step ST19 according to the embodiment, in which the holding table 11 holds the workpiece 100 under suction thereon and the upper table 21 is lifted.

The upper table lifting step is different from the holding table lowering step ST19 in that instead of operating the holding table actuator 13 to move the holding table 11 away from the upper table 21, the control unit 80 operates the upper table actuator 23 to move the upper table 21 away from the holding table 11. Other processing details of the upper table lifting step according to the first modification are the same as those of the holding table lowering step ST19 according to the embodiment.

The resin coating applying apparatus 1-2 may operate to carry out a combination of the method of applying a resin coating according to the embodiment and the method of applying a resin coating according to the first modification. Specifically, in the resin applying step ST17, the holding table actuator 13 may move the holding table 11 closely to the upper table 21, and the upper table actuator 23 may move the upper table 21 closely to the holding table 11. Moreover, the holding table lowering step ST19 and the upper table lifting step may be carried out concurrent with each other, causing the holding table actuator 13 to move the holding table 11 away from the upper table 21 and causing the upper table actuator 23 to move the upper table 21 away from the holding table 11.

The resin coating applying apparatus 1-2 and the method of applying a resin coating according to the first modification of the embodiment are as advantageous as those according to the embodiment in that they coat the workpiece 100 with the resin 202 using the solid resin 200 in the hermetically sealed processing space 4 evacuated by the vacuum pump 50, as with those according to the embodiment.

[Second Modification]

A resin coating applying apparatus and a method of applying a resin coating according to a second modification of the embodiment of the present invention will be described below. The method of applying a resin coating according to the second modification is different from the method of applying a resin coating according to the embodiment in that the heating step ST11 is carried out using the heating unit 24 in the upper table 21 rather than the heating unit 14 in the holding table 11.

In the method of applying a resin coating according to the second modification, after the holding step ST12 and the resin supplying step ST13 according to the embodiment have successively been carried out in the order named, the hermetically sealing step ST15 and the vacuum developing step ST16 are successively carried out in the order named. Then, concurrent with the resin applying step ST17 carried out subsequently, the heating step ST11 and the resin liquifying step ST14 are carried out.

In the resin applying step ST17 according to the second modification, specifically, the control unit 80 energizes the heating unit 24 to heat the pressing surface 22 of the upper table 21. In the resin applying step ST17 according to the second modification, next, the holding surface 12 of the holding table 11 and the pressing surface 22 of the upper table 21 are brought closely to each other along directions perpendicular thereto, bringing the heated pressing surface 22 of the upper table 21 into contact with the solid resin 200 supplied to the face side 101 of the workpiece 100 on the holding surface 12. In the resin applying step ST17 according to the second modification, therefore, the solid resin 200 and the workpiece 100 are heated through the pressing surface 22, and the holding surface 12 of the holding table 11 is heated by the solid resin 200 and the workpiece 100 that are heated, thus virtually performing the heating step ST11. In the resin applying step ST17 according to the second modification, in addition, the solid resin 200 is heated and melted into the liquified resin 201 through the pressing surface 22, thus virtually performing the resin liquifying step ST14.

The resin applying step ST17 according to the second modification is similar to the resin applying step ST17 according to the embodiment except that the heating step ST11 and the resin liquifying step ST14 are carried out sometime in the resin applying step ST17. The resin cooling step ST18, the holding table lowering step ST19, and the unloading step ST20 that are carried out after the resin applying step ST17 are the same as those according to the embodiment.

The method of applying a resin coating according to the second modification of the embodiment is as advantageous as the method according to the embodiment in that it coats the workpiece 100 with the resin 202 using the solid resin 200 in the hermetically sealed processing space 4 evacuated by the vacuum pump 50, as with method according to the embodiment.

[Third Modification]

A resin coating applying apparatus and a method of applying a resin coating according to a third modification of the embodiment of the present invention will be described below. The resin coating applying apparatus according to the third modification is different from the resin coating applying apparatus 1 according to the embodiment in that the delivery arm 70 is replaced with a delivery mechanism free of the ejector pins 18 and having specifications different from those of the delivery arm 70, for holding the workpiece 100 from above or sideways and delivering the workpiece 100. The method of applying a resin coating according to the third modification is different from the method according to the embodiment in that the unloading step ST20 is modified.

In the unloading step ST20 according to the third modification of the embodiment, instead of inserting the delivery arm 70 into the clearance 300 created by the ejector pins 18 between the workpiece 100 and the holding table 11 and delivering the workpiece 100, the delivery mechanism according to the third modification holds the workpiece 100 coated with the resin 202 on the holding surface 12 of the holding table 11 from above or sideways and delivers the workpiece 100.

The method of applying a resin coating according to the third modification of the embodiment is as advantageous as the method according to the embodiment, except for the advantages provided by the ejector pins 18 and the delivery arm 70, in that it coats the workpiece 100 with the resin 202 using the solid resin 200 in the hermetically sealed processing space 4 evacuated by the vacuum pump 50, as with the method according to the embodiment.

[Fourth Modification]

Figure 14:
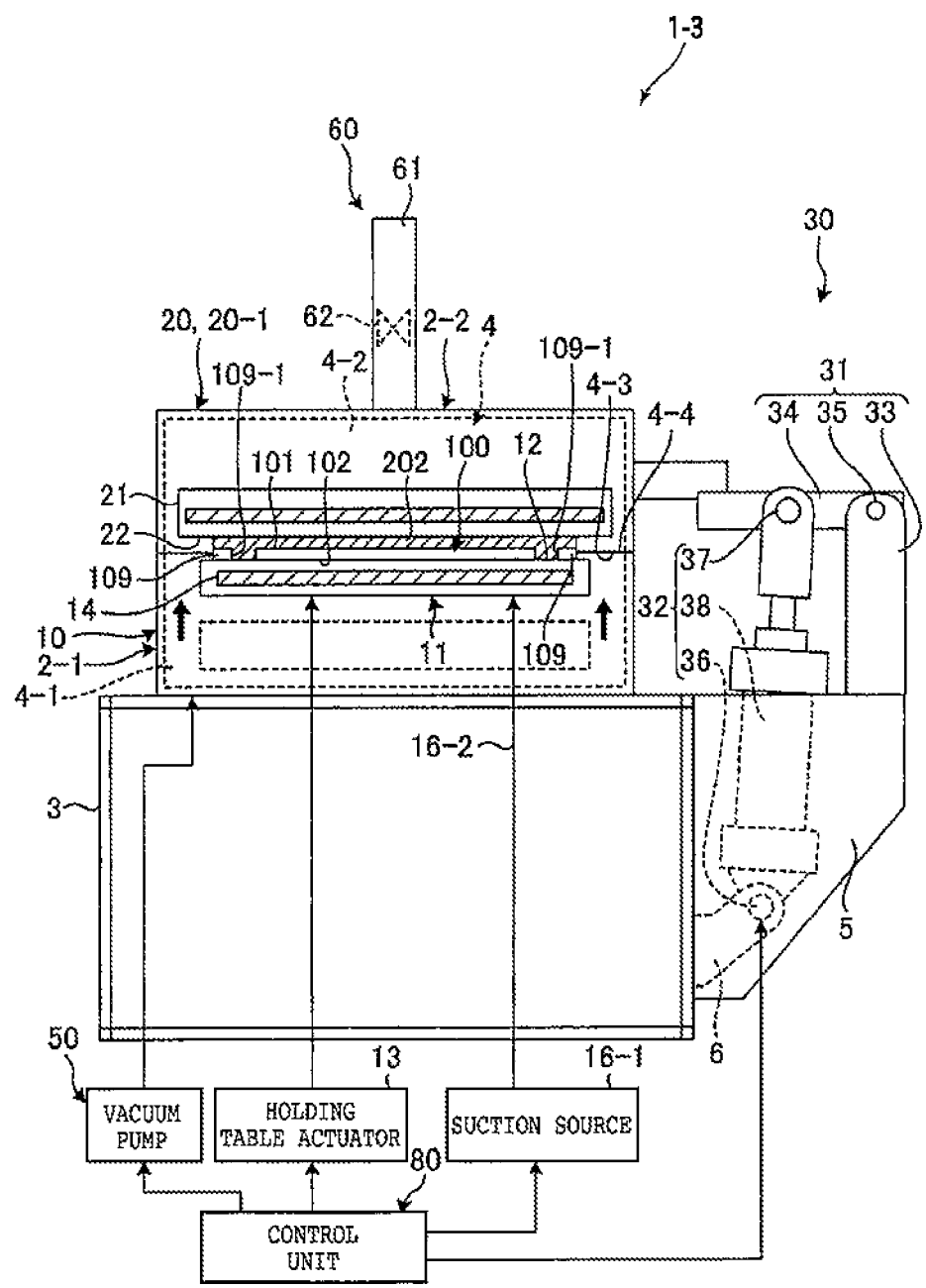
FIG. 14 is a cross-sectional view illustrating a method of applying a resin coating according to a fourth modification of the embodiment.
Figure 15:
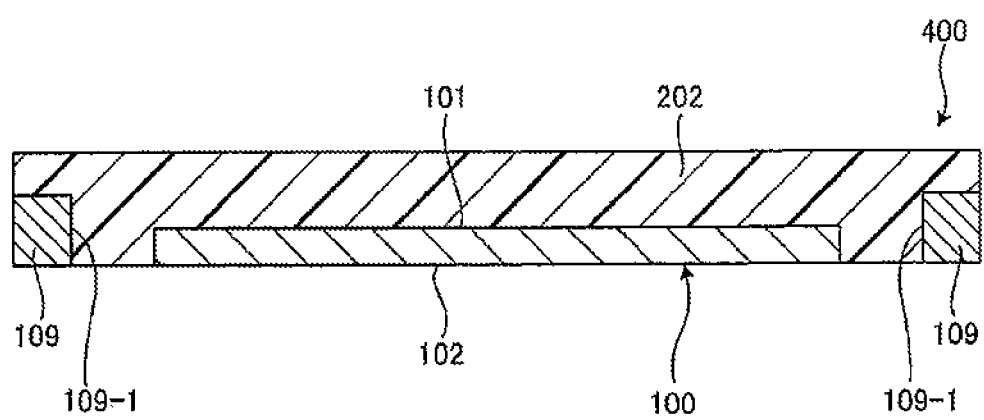
FIG. 15 is a cross-sectional view of a frame unit obtained by the method of applying a resin coating according to the fourth modification of the embodiment.

A resin coating applying apparatus 1-3 and a method of applying a resin coating according to a fourth modification of the embodiment of the present invention will be described below with reference to the drawings. FIG. 14 illustrates in cross section the method of applying a resin coating according to the fourth modification of the embodiment. FIG. 15 illustrates a frame unit 400 obtained by the method of applying a resin coating according to the fourth modification of the embodiment. In FIGS. 14 and 15, those parts which are identical to those according to the embodiment are denoted by identical reference symbols, and their description will be omitted below.

The method of applying a resin coating according to the fourth modification of the embodiment is different from the method of applying a resin coating according to the embodiment in that it includes a preparatory step, carried out before the resin supplying step ST13, in which the workpiece 100 is positioned in an opening 109-1 in an annular frame 109, and the resin 202 is spread to cover the opening 109-1 to secure the frame 109 to the workpiece 100 with the resin 202 in the resin applying step ST17. Other processing details of the method of applying a resin coating according to the fourth modification are the same as those according to the method of applying a resin coating according to the embodiment.

In the preparatory step of the method according to the fourth modification, specifically, as illustrated in FIG. 14, the frame 109 and the workpiece 100 are placed on the holding surface 12 of the holding table 11. In the preparatory step of the method according to the fourth modification, the order in which the workpiece 100 and the frame 109 are placed on the holding surface 12 is not significant. In the preparatory step, therefore, the workpiece 100 is positioned in the opening 109-1 in the annular frame 109 on the holding surface 12 of the holding table 11.

In the resin supplying step ST13 according to the fourth modification, the solid resin 200 should preferably be supplied to the frame 109 and the region between the workpiece 100 and the frame 109 on the holding surface 12 of the holding table 11, in addition to the face side 101, i.e., the upwardly exposed surface, of the workpiece 100.

In the resin applying step ST17 according to the fourth modification, the resin 202 is spread on the frame 109 and the region between the workpiece 100 and the frame 109 on the holding surface 12 of the holding table 11, in addition to the face side 101 of the workpiece 100, thereby securing the frame 109 to the workpiece 100 with the resin 202 to obtain the frame unit 400 illustrated in FIG. 15.

The frame unit 400 is obtained by the method of applying a resin coating according to the fourth modification. As illustrated in FIG. 15, the frame unit 400 has the workpiece 100, the frame 109 surrounding the workpiece 100 in the opening 109-1, and the resin 202 covering respective surfaces of the workpiece 100 and the frame 109 and affixed to the workpiece 100 and the frame 109. The resin 202 fills a gap between the outer circumferential edge of the workpiece 100 and an edge of the frame 109 that defines the opening 109-1, and firmly integrates the workpiece 100 and the frame 109 with each other, thereby firmly securing the workpiece 100 in the opening 109-1 in the annular frame 109.

The resin coating applying apparatus 1-3 and the method of applying a resin coating according to the fourth modification are as advantageous as those according to the embodiment in that they coat the workpiece 100 with the resin 202 using the solid resin 200 in the hermetically sealed processing space 4 evacuated by the vacuum pump 50, as with those according to the embodiment. In addition, the resin coating applying apparatus 1-3 and the method of applying a resin coating according to the fourth modification are advantageous in that the workpiece 100 is secured in the opening 109-1 in the annular frame 109 at the same time that the workpiece 100 is coated with the resin 202.

The present invention is not limited to the above embodiment and modifications. Rather, various changes and modifications may be made therein without departing from the scope of the invention. For example, the solid resin 200 used in the above embodiment and modifications may be colored with a dark color such as black or the like or may be mixed with an ultraviolet absorbing agent for protecting device circuits from ultraviolet rays or concealing device circuits.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A resin coating applying apparatus for coating a surface of a workpiece with a resin layer, comprising:
    a housing including a holding table for holding the workpiece under suction thereon and a holding table actuator for moving the holding table upwardly and downwardly, the housing having an opening defined therein;
    a delivery arm combined with an actuating mechanism that actuates the delivery arm for loading and unloading the workpiece to and from the holding table,
    a lid for covering the opening in the housing to create a processing space hermetically sealed by the lid and the housing and enclosing the holding table and the workpiece within the processing space;
    a lid actuator operatively coupling the housing and the lid to each other, for actuating the lid to open and close angularly with respect to the housing;
    a resin supply for supplying a solid resin to the workpiece held on the holding table;
    a heating unit for heating the solid resin supplied to the workpiece to melt the solid resin to form a liquified resin on the work piece;
    a vacuum pump for evacuating the processing space hermetically sealed by the housing and the lid; and
    an atmospheric vent valve for introducing atmospheric air into the processing space to cool the liquified resin formed on the workpiece,
    wherein the lid includes an upper table disposed opposite the holding table and movable relatively closely to the holding table to spread the liquified resin formed on the workpiece and coat the workpiece with the liquified resin, and
    the heating unit is disposed in one of or both the holding table and the upper table.

2. The resin coating applying apparatus according to claim 1, wherein the lid actuator includes a locus limiter for limiting a locus of the lid relatively movable with respect to the housing, and
    an actuation controller for applying actuating forces to the locus limiter to move the lid relatively to the housing,
    the locus limiter includes
    a fixed arm fixed with respect to the housing, a movable arm fixed with respect to the lid for movement with the lid, and a fulcrum point by which the fixed arm and the movable arm are relatively rotatably coupled to each other,
    the actuation controller includes
    a cylinder that extends and contracts uniaxially for applying actuating forces,
    the cylinder having an end rotatably coupled to the housing and another end rotatably coupled to the movable arm, and
    when the cylinder extends and contracts, an angle formed between the fixed arm and the movable arm at the fulcrum point is changed to move the lid relatively to the housing.

3. The resin coating applying apparatus according to claim 1, further comprising:
    wherein the delivery arm includes
    a suction pad for attracting the workpiece under suction, and
    a pad actuator for actuating the suction pad,
    the holding table includes
    a holding surface for holding the workpiece thereon,
    a suction groove defined in the holding surface, and
    a fluid communication channel providing fluid communication between the suction groove and a suction source,
    the holding surface includes at least three ejector pins and at least three pin actuators for moving the ejector pins upwardly and downwardly, and
    the ejector pins are moved to a height equal to or smaller than a height of the holding surface when the workpiece is to be held on the holding table, and are moved to a height larger than the height of the holding surface when the workpiece is to be unloaded from the holding table, and
    the delivery arm is inserted into a clearance created by the ejector pins between the workpiece and the holding table and delivers the workpiece from the holding table.

* * * * *